United States Patent
Na et al.

(10) Patent No.: US 11,531,277 B2
(45) Date of Patent: Dec. 20, 2022

(54) EXTREME ULTRAVIOLET (EUV) MASK INSPECTION SYSTEM, A LOAD-LOCK CHAMBER INCLUDED THEREIN, AND A METHOD FOR INSPECTING AN EUV MASK USING THE EUV MASK INSPECTION SYSTEM

(71) Applicant: Samsung Electronics Co., Ltd., Suwon-si (KR)

(72) Inventors: Jihoon Na, Bucheon-si (KR); Sungho Kang, Hwaseong-si (KR); Jaewhan Sung, Suwon-si (KR); Hak-Seok Lee, Hwaseong-si (KR); Hyunjune Cho, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/499,182

(22) Filed: Oct. 12, 2021

(65) Prior Publication Data

US 2022/0283519 A1  Sep. 8, 2022

(30) Foreign Application Priority Data

Mar. 3, 2021 (KR) .................. 10-2021-0028237

(51) Int. Cl.
*G03F 7/20* (2006.01)
*G03F 1/86* (2012.01)

(52) U.S. Cl.
CPC ............ *G03F 7/70841* (2013.01); *G03F 1/86* (2013.01); *G03F 7/70825* (2013.01); *G03F 7/70875* (2013.01); *G03F 7/70916* (2013.01)

(58) Field of Classification Search
CPC ............ G03F 7/70825; G03F 7/70841; G03F 7/70875; G03F 7/70916; G03F 1/86
See application file for complete search history.

(56) References Cited

U.S. PATENT DOCUMENTS

| 7,518,132 B2 | 4/2009 | Kanazawa et al. |
| 7,992,394 B2 | 8/2011 | Oikawa |
| 2008/0302390 A1 | 12/2008 | Rastegar |
| 2012/0182538 A1 | 7/2012 | Koole et al. |

FOREIGN PATENT DOCUMENTS

| JP | 2004103512 A | 4/2004 | |
| JP | 2010016200 A | 1/2010 | |
| JP | 2010536066 A | * 11/2010 | |
| KR | 102009986 B1 | 8/2019 | |
| WO | WO-2018197191 A1 | * 11/2018 | ............... B08B 5/00 |

* cited by examiner

*Primary Examiner* — Peter B Kim
(74) *Attorney, Agent, or Firm* — Myers Bigel, P.A.

(57) ABSTRACT

An EUV mask inspection system includes a mask receiving unit configured to receive a manufactured EUV mask, a main chamber configured to perform an inspection on the EUV mask, and a load-lock chamber disposed between the mask receiving unit and the main chamber. The load-lock chamber includes a mask table for loading the EUV mask, an UV lamp disposed adjacent the mask table in a first direction, a cold trap disposed adjacent the mask table in a second direction, and a vacuum pump. The first direction is a direction perpendicular to a sidewall of the mask table, and the second direction is a direction perpendicular to a top surface of the mask table. The UV lamp is configured to evaporate water molecules on the EUV mask by irradiating UV light onto the EUV mask. The cold trap is configured to trap the water molecules evaporated from the EUV mask.

20 Claims, 22 Drawing Sheets

EXTREME ULTRAVIOLET (EUV) MASK INSPECTION SYSTEM, A LOAD-LOCK CHAMBER INCLUDED THEREIN, AND A METHOD FOR INSPECTING AN EUV MASK USING THE EUV MASK INSPECTION SYSTEM

CROSS-REFERENCE TO RELATED APPLICATION

This U.S. non-provisional patent application claims priority under 35 U.S.C. § 119 to Korean Patent Application No. 10-2021-0028237, filed on Mar. 3, 2021, in the Korean Intellectual Property Office, the disclosure of which is hereby incorporated by reference in its entirety.

BACKGROUND

Embodiments of the inventive concepts relate to a system for inspecting a reflective mask (i.e., an extreme ultraviolet (EUV) mask) used in an EUV exposure process, a load-lock chamber included in the inspection system, and a method for inspecting the reflective mask (i.e., the EUV mask) using the inspection system.

Recently, as line widths of semiconductor circuits have been gradually reduced, light sources having shorter wavelengths have been required. For example, extreme ultraviolet (EUV) light may be used as an exposure light source. Generally, a reflective EUV mask may be used in an EUV exposure process due to an absorption property of the EUV light. As the difficulty of an exposure process gradually increases, a small error in an EUV mask may cause a serious error in a circuit pattern on a wafer. Thus, an EUV mask inspection process may be performed to check whether or not a defect exists in the EUV mask. Here, the defect may be a contaminant (e.g., a fine particle) on the EUV mask and/or an error of a shape or size of a pattern formed in the EUV mask.

SUMMARY

Embodiments of the inventive concepts may provide an EUV mask inspection system capable of preventing damage of an EUV mask.

Embodiments of the inventive concepts may also provide a method for inspecting an EUV mask, which is capable of preventing damage of the EUV mask.

In an aspect, an EUV mask inspection system may include a mask receiving unit configured to receive a manufactured EUV mask, a main chamber configured to perform an inspection on the EUV mask, and a load-lock chamber disposed between the mask receiving unit and the main chamber. The load-lock chamber may include a mask table for loading the EUV mask, an ultraviolet (UV) lamp disposed adjacent the mask table in a first direction, a cold trap disposed adjacent the mask table in a second direction that is perpendicular to the first direction, and a vacuum pump. The first direction may be a direction perpendicular to a sidewall of the mask table, and the second direction may be a direction perpendicular to a top surface of the mask table. The UV lamp may be configured to evaporate water molecules on the EUV mask by irradiating UV light onto the EUV mask, and the cold trap may be configured to trap the water molecules evaporated from the EUV mask.

In an aspect, a load-lock chamber may include a mask table for loading an EUV mask, an UV lamp disposed adjacent the mask table in a first direction, a cold trap disposed adjacent the mask table in a second direction that is perpendicular to the first direction, a vacuum pump, and an inner gate valve disposed between the mask table and the cold trap. The inner gate valve may divide an inner space of the load-lock chamber into a first inner space in which the mask table is disposed, and a second inner space in which the cold trap is disposed.

In an aspect, a method for inspecting an EUV mask may include loading a manufactured EUV mask into a mask receiving unit, moving the EUV mask from the mask receiving unit into a load-lock chamber, irradiating UV light onto the EUV mask by an UV lamp of the load-lock chamber to evaporate water molecules on the EUV mask by the UV light, trapping the water molecules evaporated from the EUV mask by using a cold trap of the load-lock chamber, moving the EUV mask from the load-lock chamber into a main chamber, and performing an inspection on the EUV mask in the main chamber.

BRIEF DESCRIPTION OF THE DRAWINGS

The inventive concepts will become more apparent in view of the attached drawings and accompanying detailed description.

DETAILED DESCRIPTION

Figure 1:
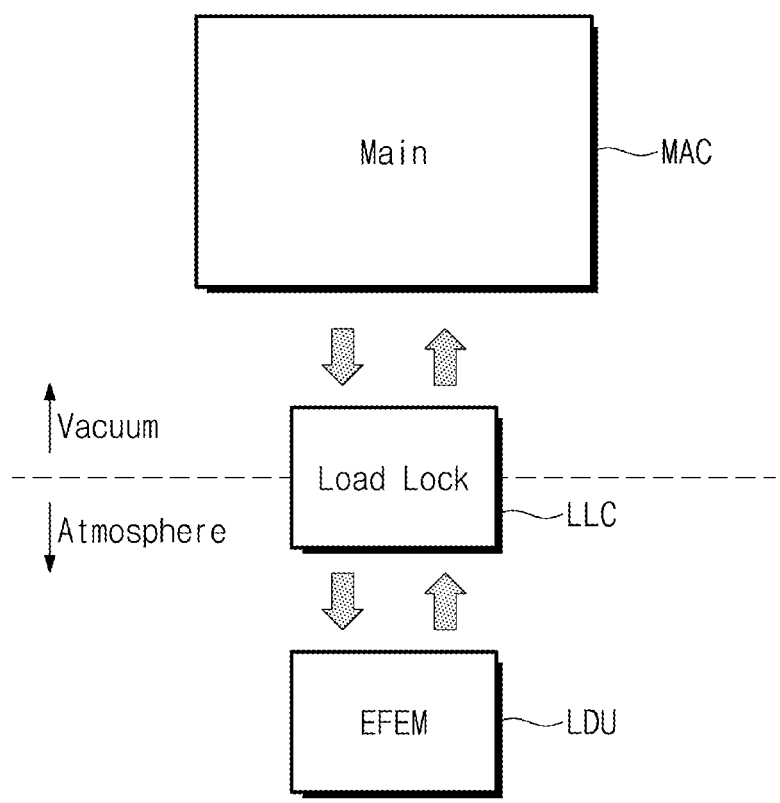
FIG. 1 is a block structural view schematically illustrating an EUV mask inspection system according to some embodiments of the inventive concepts.

FIG. 1 is a block structural view schematically illustrating an EUV mask inspection system according to some embodiments of the inventive concepts.

Referring to FIG. 1, an extreme ultraviolet (EUV) mask inspection system according to some embodiments of the inventive concepts may include a mask receiving unit LDU, a load-lock chamber LLC, and a main chamber MAC.

The load-lock chamber LLC may function as a path through which an EUV mask is supplied from the mask receiving unit LDU into the main chamber MAC and is unloaded from the main chamber MAC into the mask receiving unit LDU. The load-lock chamber LLC may be coupled to an entrance and/or an exit of the main chamber MAC and may alternately maintain an atmospheric pressure state and a vacuum state. Here, the EUV mask may be a photomask used in an EUV lithography process for forming a pattern on a semiconductor substrate (e.g., a semiconductor wafer).

The mask receiving unit LDU may be a chamber capable of directly receiving the EUV mask. For example, the mask receiving unit LDU may be an equipment front end module (EFEM). The mask receiving unit LDU may be in an atmospheric pressure state.

The main chamber MAC may be an inspection apparatus for inspecting the EUV mask, a process apparatus for performing a process on the EUV mask, or an exposure apparatus (e.g., see FIG. 4) using the EUV mask. According to the present embodiments, the main chamber MAC may be an inspection apparatus including an electron microscope (e.g., a scanning electron microscope (SEM)) for inspecting a manufactured EUV mask. The main chamber MAC may be in a vacuum state (e.g., $10^{-7}$ torr or less, i.e., an ultra-high vacuum state) or in a hydrogen environment.

In the EUV mask inspection system according to embodiments of the inventive concepts, the inspection of the EUV mask may be performed in the order indicated by the arrows. For example, the EUV mask received in the mask receiving unit LDU may be transferred into the load-lock chamber LLC. The EUV mask may be transferred from the load-lock chamber LLC into the main chamber MAC, and then, a mask inspection may be performed on the EUV mask in the main chamber MAC. When the inspection of the EUV mask is completed, the EUV mask may be transferred into the load-lock chamber LLC. The EUV mask may be transferred from the load-lock chamber LLC into the mask receiving unit LDU. A space above the dashed line passing through the load-lock chamber LLC may be a space maintained in a vacuum state, and a space below the dashed line may be a space maintained in an atmospheric pressure state.

Figure 2:
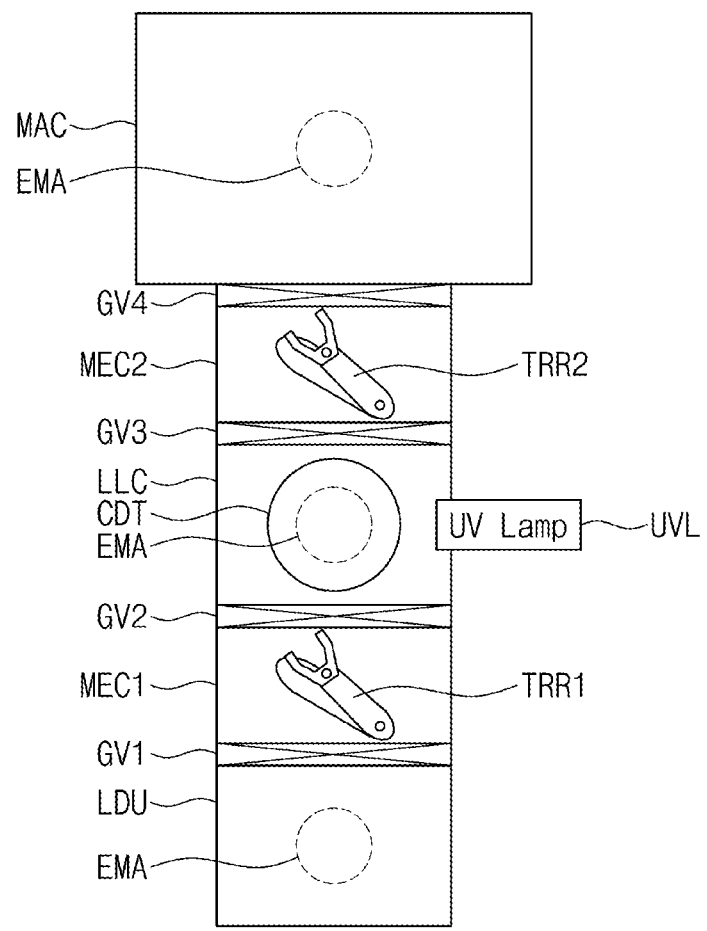
FIG. 2 is a schematic view illustrating the EUV mask inspection system of FIG. 1.

FIG. 2 is a schematic view illustrating the EUV mask inspection system of FIG. 1. Hereinafter, the descriptions to the same features as mentioned in FIG. 1 will be omitted or mentioned briefly in the interest of brevity.

Referring to FIG. 2, an EUV mask inspection system according to the present embodiments may include a mask receiving unit LDU, a first mask transfer chamber MEC1, a load-lock chamber LLC, a second mask transfer chamber MEC2, and a main chamber MAC. A circle illustrated by the dashed lines in FIG. 2 virtually represents an EUV mask EMA corresponding to an inspection target.

A first gate valve GV1 corresponding to an entrance or exit may be provided between the mask receiving unit LDU and the first mask transfer chamber MEC1. A second gate valve GV2 may be provided between the first mask transfer chamber MEC1 and the load-lock chamber LLC. A third gate valve GV3 may be provided between the load-lock chamber LLC and the second mask transfer chamber MEC2. A fourth gate valve GV4 may be provided between the second mask transfer chamber MEC2 and the main chamber MAC. The EUV mask EMA may move between the chambers through each of the first to fourth gate valves GV1 to GV4.

The first mask transfer chamber MEC1 may include a first transfer robot TRR1, and the second mask transfer chamber MEC2 may include a second transfer robot TRR2. The first transfer robot TRR1 may move the EUV mask EMA between the mask receiving unit LDU and the load-lock chamber LLC. The second transfer robot TRR2 may move the EUV mask EMA between the load-lock chamber LLC and the main chamber MAC.

The load-lock chamber LLC may include an ultraviolet (UV) lamp UVL and a cold trap CDT. The cold trap CDT may be disposed to vertically align or overlap with the EUV mask EMA fixed in the load-lock chamber LLC. The UV lamp UVL may be disposed adjacent to a side surface of the EUV mask EMA. A single UV lamp UVL is illustrated as an example in FIG. 2. Alternatively, a plurality of UV lamps UVL may be provided in the load-lock chamber LLC.

An input/output process of the EUV mask EMA through the load-lock chamber LLC will be described as some embodiments of the inventive concepts. A manufactured EUV mask EMA may be received in the mask receiving unit LDU. The load-lock chamber LLC may be prepared in an atmospheric pressure state. The EUV mask EMA may be moved from the mask receiving unit LDU into the load-lock chamber LLC by the first transfer robot TRR1 of the first mask transfer chamber MEC1.

When the EUV mask EMA is provided or received in the load-lock chamber LLC, an inner space of the load-lock chamber LLC may become a vacuum state by a vacuum pump. A process of removing moisture (e.g., water) on the EUV mask EMA according to some embodiments of the inventive concepts, to be described below, may be performed in the load-lock chamber LLC. The process of removing moisture may be performed by the UV lamp UVL and the cold trap CDT.

The EUV mask EMA from which the moisture is removed may be moved from the load-lock chamber LLC into the main chamber MAC in a vacuum state by the second transfer robot TRR2 of the second mask transfer chamber MEC2. An inspection may be performed on the EUV mask EMA in the main chamber MAC.

After the inspection is completed, the EUV mask EMA may be moved from the main chamber MAC into the load-lock chamber LLC by the second transfer robot TRR2 of the second mask transfer chamber MEC2. The inner space of the load-lock chamber LLC may be changed into an atmospheric pressure state through venting. The EUV mask EMA may be moved from the load-lock chamber LLC into the mask receiving unit LDU by the first transfer robot TRR1 of the first mask transfer chamber MEC1.

Figure 3:
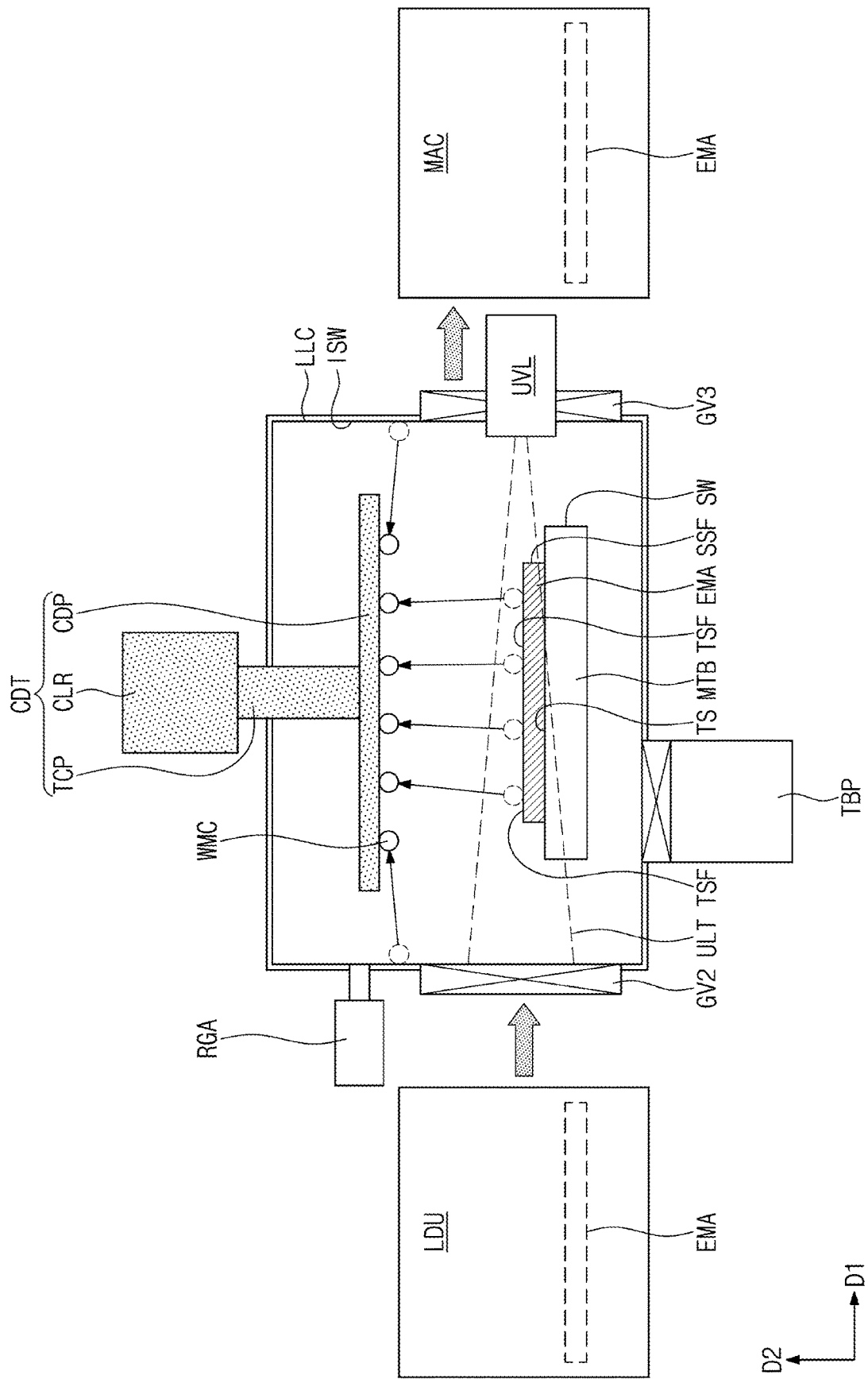
FIG. 3 is a cross-sectional view schematically illustrating a load-lock chamber in which an EUV mask is provided, according to some embodiments of the inventive concepts.

FIG. 3 is a cross-sectional view schematically illustrating a load-lock chamber in which an EUV mask is provided, according to some embodiments of the inventive concepts.

Referring to FIG. 3, the load-lock chamber LLC may include a mask table MTB, a vacuum pump TBP, an UV lamp UVL, a cold trap CDT, and a moisture measuring device RGA. The EUV mask EMA moved from the mask receiving unit LDU or the main chamber MAC may be loaded on the mask table MTB. In other words, the EUV mask EMA may be provided on the mask table MTB in the load-lock chamber LLC. The EUV mask EMA may be fixed on the mask table MTB.

The vacuum pump TBP may be provided at a lower portion of the load-lock chamber LLC. The vacuum pump TBP may exhaust air in the load-lock chamber LLC to the outside to form the inside (i.e., the inner space) of the load-lock chamber LLC into a vacuum state. For example, the vacuum pump TBP may be a turbo pump.

The cold trap CDT may include a cooling part CLR, a heat transfer part TCP, and a cold plate CDP. The cold plate CDP may be provided in the load-lock chamber LLC, and the cooling part CLR may be provided outside the load-lock chamber LLC. The heat transfer part TCP may connect the cold plate CDP to the cooling part CLR.

The cooling part CLR may include a refrigeration cycle. The cooling part CLR may be cooled to a low temperature by a refrigerant of the refrigeration cycle. The heat transfer part TCP and the cold plate CDP may include a metal having a high thermal conductivity. The heat transfer part TCP may transfer heat from the cold plate CDP to the cooling part CLR. In other words, when the cooling part CLR is cooled, the cold plate CDP may be cooled through the heat transfer part TCP.

The cold plate CDP may be spaced apart from the mask table MTB in a vertical direction (i.e., a second direction D2). The second direction D2 may be a direction perpendicular to a top surface TSF of the EUV mask EMA or a top surface TS of the mask table MTB.

The cold plate CDP may be disposed to vertically align or overlap with the mask table MTB. In other words, the cold plate CDP may vertically align or overlap with the EUV mask EMA disposed on the mask table MTB. The cold plate CDP may have a circular shape or a tetragonal shape or a polygonal shape when viewed in a plan view, and a planar area of the cold plate CDP may be equal to or greater than a planar area of the mask table MTB.

The UV lamp UVL may be a device for performing UV exposure on the EUV mask EMA. The UV lamp UVL may be equipped to expose the entire or whole of the top surface TSF of the EUV mask EMA. The UV lamp UVL may transfer energy to the entire or whole of the top surface TSF of the EUV mask EMA through UV light ULT.

The UV lamp UVL may have at least one of various structures, and various components. In some embodiments, the UV lamp UVL may be coupled to the load-lock chamber LLC to perform the UV exposure on the whole of the top surface TSF of the EUV mask EMA in-situ in the load-lock chamber LLC. Here, the term 'in-situ' may mean that a process is performed while maintaining a vacuum continuously. For example, a portion of the UV lamp UVL, from which the UV light ULT is irradiated, may be disposed in the load-lock chamber LLC.

In certain embodiments, even though not shown in the drawings, the UV lamp UVL may be equipped outside the load-lock chamber LLC. A transparent window may be disposed at a side surface of the load-lock chamber LLC, and thus UV light irradiated from the UV lamp UVL equipped at the outside may be incident into the load-lock chamber LLC through the transparent window. Here, the transparent window may be formed of a transparent material to the UV light.

In the load-lock chamber LLC, the UV lamp UVL may be located at a different position from that of the cold plate CDP. The cold trap CDT including the cold plate CDP may be provided at a top surface of the load-lock chamber LLC, and the UV lamp UVL may be provided at a side surface of the load-lock chamber LLC. The UV lamp UVL may be spaced apart from a side surface SSF of the EUV mask EMA in a horizontal direction (i.e., a first direction D1). The UV lamp UVL may be disposed adjacent to a sidewall SW of the mask table MTB in the first direction D1. The first direction D1 may be a direction perpendicular to the side surface SSF of the EUV mask EMA or the sidewall SW of the mask table MTB. The UV lamp UVL may be spaced apart from the cold trap CDT (e.g., the cold plate CDP) in a vertical direction (i.e., the second direction D2).

In the present embodiments, the cold trap CDT (i.e., the cold plate CDP) and the UV lamp UVL may be adjacent to the mask table MTB in different directions from each other. Thus, when the UV lamp UVL emits or irradiate the UV light ULT, the cold plate CDP may not interfere with the UV light ULT. In addition, water molecules WMC evaporated from the EUV mask EMA may directly move to the cold plate CDP without interference of the UV lamp UVL.

The moisture measuring device RGA may be provided adjacent to the cold plate CDP. The moisture measuring device RGA may measure moisture collected on the cold plate CDP.

Hereinafter, a process of removing moisture on the EUV mask EMA by the load-lock chamber LLC illustrated in FIG. 3 will be described briefly. Moisture (i.e., water molecules WMC) may remain on the top surface TSF of the EUV mask EMA exposed to the atmosphere. The water molecules WMC on the EUV mask EMA may remain on the top surface TSF of the EUV mask EMA even though the load-lock chamber LLC becomes a vacuum state. In addition, water molecules WMC may also remain on an inner sidewall ISW of the load-lock chamber LLC exposed to the atmosphere.

The UV light ULT may be incident onto the top surface TSF of the EUV mask EMA by the UV lamp UVL. The UV light ULT may transfer energy to the top surface TSF of the EUV mask EMA to detach the water molecules WMC from the top surface TSF of the EUV mask EMA. In other words, the UV lamp UVL may transfer vaporization energy onto the EUV mask EMA.

According to embodiments of the inventive concepts, the UV lamp UVL may not irradiate the UV light ULT in a direction perpendicular to the top surface TSF of the EUV mask EMA but may irradiate the UV light ULT in a direction parallel or oblique to the top surface TSF of the EUV mask EMA. The UV lamp UVL may irradiate the UV light ULT in a path that is parallel to the top surface TSF of the EUV mask EMA or that defines an acute angle with the top surface TSF of the EUV mask EMA. If the UV light ULT is incident in the direction perpendicular to the top surface TSF of the EUV mask EMA, an absorption layer ABL and a capping layer CPL (see FIG. 5) located at the top surface TSF of the EUV mask EMA may be damaged by the UV light ULT. Meanwhile, since the UV lamp UVL of embodiments of the inventive concepts is used to evaporate the water molecules WMC remaining on the top surface TSF of the EUV mask EMA, the water molecules WMC may be sufficiently evaporated even though the UV light ULT is incident in the direction parallel to the top surface TSF of the EUV mask EMA. In addition, it is possible to prevent the top surface TSF of the EUV mask EMA from being damaged by the UV light ULT.

The water molecules WMC detached from the top surface TSF of the EUV mask EMA may be condensed or collected on a surface of the cooled cold plate CDP. In other words, the cold trap CDT may trap or capture the evaporated water molecules WMC. The cold trap CDT may trap or capture the water molecules WMC detached from the inner sidewall ISW of the load-lock chamber LLC as well as the water molecules WMC detached from the EUV mask EMA. According to embodiments of the inventive concepts, the cold plate CDP may be disposed to vertically align or overlap with the EUV mask EMA, and thus the cold plate CDP may effectively trap or capture the water molecules WMC evaporated and moved in the second direction D2. In addition, the area of the cold plate CDP may be greater than the area of the EUV mask EMA, and thus the cold plate CDP may effectively trap or capture the water molecules WMC detached from the EUV mask EMA.

Figure 4:
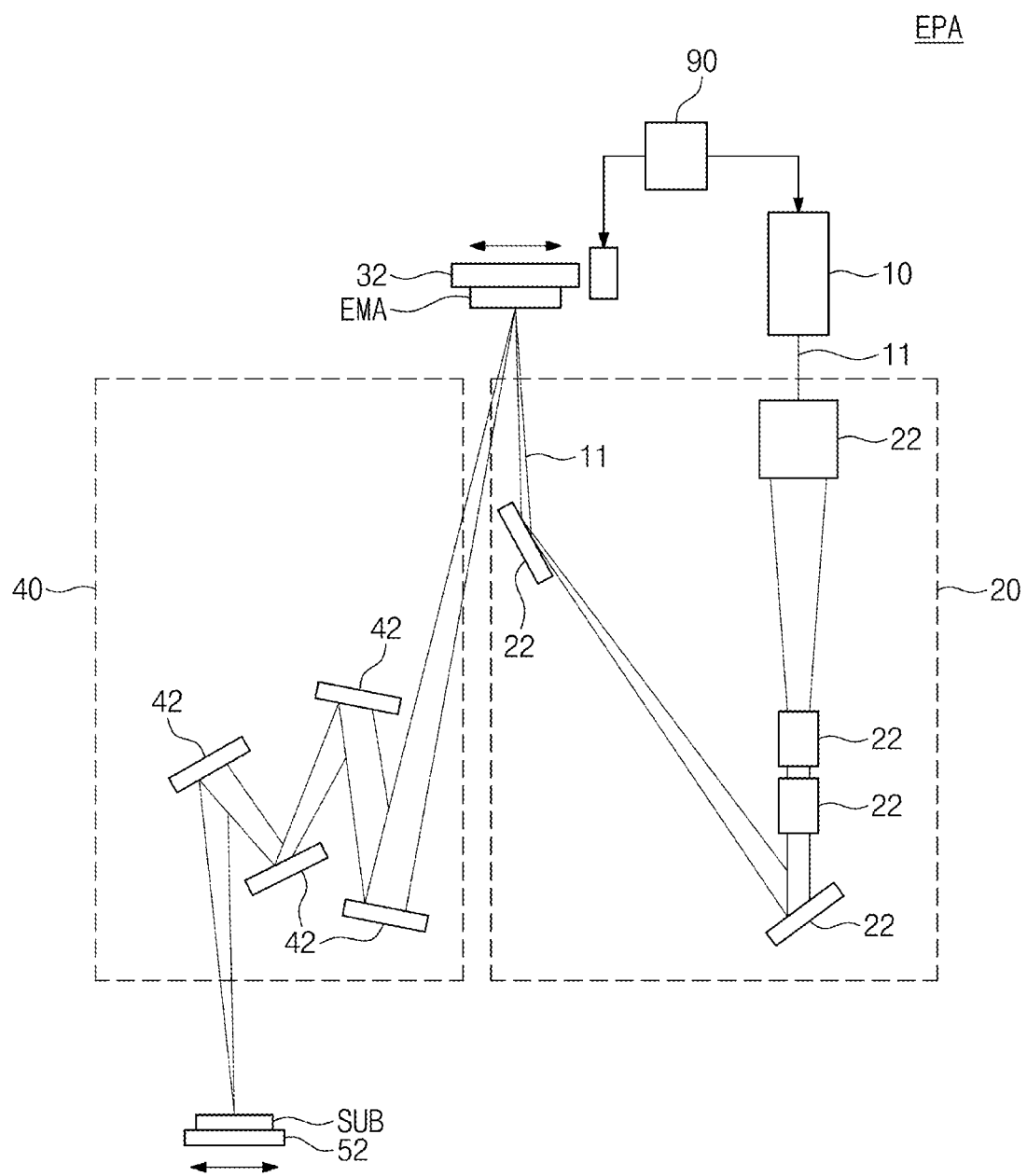
FIG. 4 is a schematic view illustrating an EUV exposure apparatus to explain an EUV mask according to some embodiments of the inventive concepts.

FIG. 4 is a schematic view illustrating an EUV exposure apparatus to explain an EUV mask according to some embodiments of the inventive concepts.

Referring to FIG. 4, an EUV exposure apparatus EPA may include an optical source unit 10, a condenser unit 20, a projection unit 40, and a controller 90. The optical source unit 10 may generate EUV light, for example, light having a wavelength of 4 nm to 124 nm. In some embodiments, the optical source unit 10 may generate EUV light, for example, light having a wavelength of 13.5 nm. The optical source unit 10 may generate light having energy of 6.21 eV to 124 eV (particularly, energy of 90 eV to 95 eV).

The optical source unit 10 may generate the EUV light but may undesirably generate deep ultraviolet (DUV) light (e.g., light having a wavelength of 100 nm to 300 nm). The condenser unit 20 may guide light 11 generated from the optical source unit 10 in such a way that the light 11 is reflected from an EUV mask EMA loaded on a mask stage 32. In other words, the EUV mask EMA according to embodiments of the inventive concepts may be a reflective mask.

The condenser unit 20 may include a condenser optics 22, for example, a lens and/or a mirror. The condenser optics 22 may condense and reflect the light 11 to guide the light 11 to the EUV mask EMA. The light 11 may be obliquely incident to the EUV mask EMA through the condenser unit 20. The mask stage 32 may move the EUV mask EMA in a scan direction of the EUV mask EMA. The optical source unit 10 and the mask stage 32 may be controlled by the controller 90.

The light 11 incident to the EUV mask EMA may be reflected by the EUV mask EMA and then may be obliquely incident to the projection unit 40. The projection unit 40 may project a mask pattern (e.g., an absorption pattern) of the EUV mask EMA onto a semiconductor substrate SUB located on a substrate stage 52. For example, the semiconductor substrate SUB may be a silicon wafer on which an integrated circuit is formed. A photoresist capable of reacting to light may be coated on the semiconductor substrate SUB. The substrate stage 52 may move the semiconductor substrate SUB to change an exposure region (or an exposure position) of the semiconductor substrate SUB.

The projection unit 40 may include a reflective projection optics 42, for example, a lens. The reflective projection optics 42 may project the mask pattern of the EUV mask EMA onto the semiconductor substrate SUB at a predetermined magnification (e.g., ¼, ⅙, or ⅛) by using the light 11 obliquely reflected from the EUV mask EMA.

Figure 5:
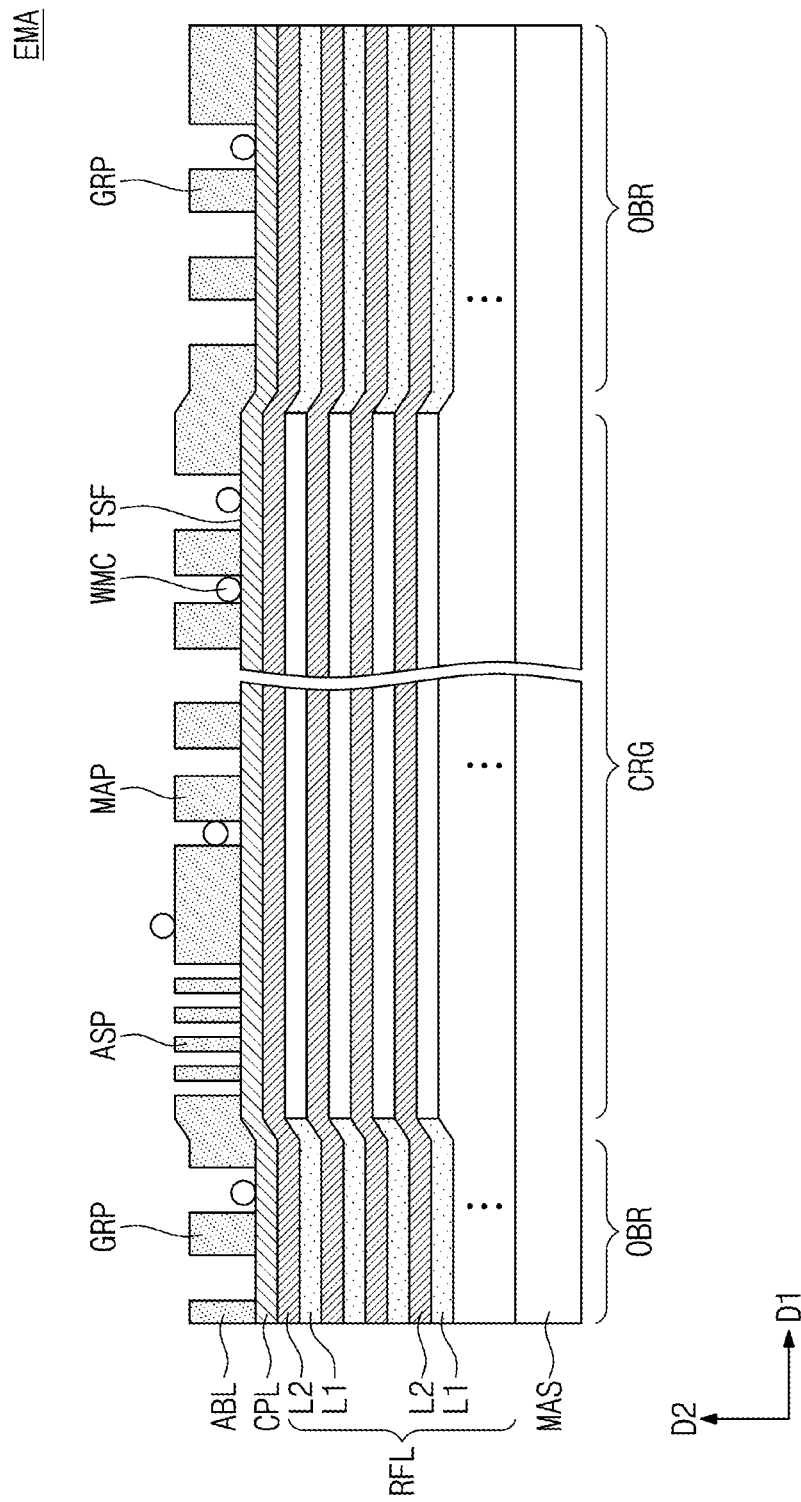
FIGS. 5 and 6 are cross-sectional views illustrating a process of removing moisture on an EUV mask, according to some embodiments of the inventive concepts.
Figure 6:
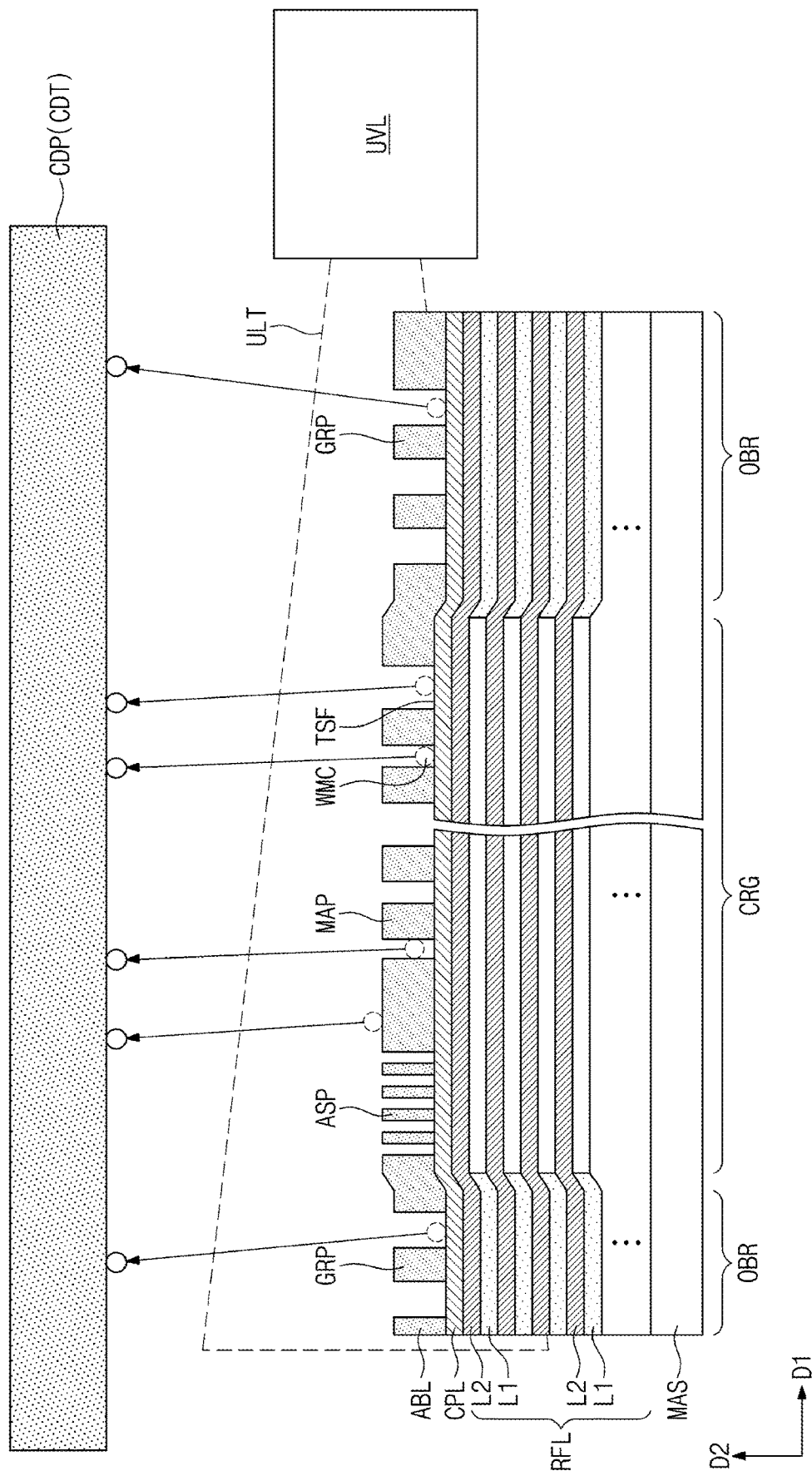

FIGS. 5 and 6 are cross-sectional views illustrating a process of removing moisture on an EUV mask, according to some embodiments of the inventive concepts.

Referring to FIG. 5, the EUV mask EMA may include a main or central region CRG provided in a central region thereof, and an out-of-band or outer region OBR provided around the main region CRG. The main region CRG may transfer or project patterns constituting an integrated circuit in a chip region of the semiconductor substrate SUB of FIG. 4.

The out-of-band region OBR may form a border or edge of the EUV mask EMA. The out-of-band region OBR may not reflect light incident to the EUV mask EMA but may absorb or scatter the whole of the light. For example, the out-of-band region OBR may absorb the EUV light and may scatter the DUV light. Since light is not reflected from the out-of-band region OBR, grating patterns GRP formed in the out-of-band region OBR may not be projected onto the semiconductor substrate SUB of FIG. 4.

The EUV mask EMA may include a mask substrate (or a reticle substrate) MAS, a reflective layer RFL, a capping layer CPL, and an absorption layer ABL. The mask substrate MAS may be a glass or quartz substrate. The reflective layer RFL may be disposed on the mask substrate MAS. The reflective layer RFL may reflect incident light. For example, the reflective layer RFL may have a multi-layered structure in which a first layer L1 and a second layer L2 are alternately and repeatedly stacked 30 times to 60 times. For example, the first layer L1 may include silicon (Si) and/or a silicon compound. The second layer L2 may include molybdenum (Mo) and/or a molybdenum compound.

The capping layer CPL may be provided on the reflective layer RFL to protect the reflective layer RFL. For example, the capping layer CPL may include ruthenium (Ru) or ruthenium oxide. In certain embodiments, even though not shown in the drawings, the capping layer CPL may be omitted.

The absorption layer ABL may be provided on the capping layer CPL. The absorption layer ABL may include an inorganic material or a metal. The absorption layer ABL may include a tantalum (Ta)-based compound. For example, the absorption layer ABL may include TaN, TaBN, or TaBON. However, embodiments of the inventive concepts are not limited thereto. In certain embodiments, the absorption layer ABL may include other opaque inorganic material or metal, for example, Cr, CrO, Ni, Cu, Mo, Al, Ti, W, or Ru. The absorption layer ABL may be exposed to the outside of the EUV mask EMA.

The absorption layer ABL of the out-of-band region OBR may include grating patterns GRP. In other words, the absorption layer ABL of the out-of-band region OBR may have a grating shape. The grating patterns GRP of the absorption layer ABL may scatter incident light. For example, the grating patterns GRP may effectively scatter the DUV light to prevent the DUV light from being reflected.

The reflective layer RFL of the out-of-band region OBR may be treated by an optical density (OD) treatment such as a laser annealing, and thus the reflective layer RFL may not reflect light. In other words, the reflective layer RFL of the out-of-band region OBR may absorb light. For example, the first layer L1 in the out-of-band region OBR may be changed from silicon (Si) into silicon nitride (SiN) by the OD treatment.

In some embodiments, the absorption layer ABL of the out-of-band region OBR may be located at a lower level than the absorption layer ABL of the main region CRG. However, embodiments of the inventive concepts are not limited thereto. In certain embodiments, the absorption layer ABL of the out-of-band region OBR may be located at the same level as or a higher level than the absorption layer ABL of the main region CRG.

The absorption layer ABL of the main region CRG may include a plurality of main patterns MAP. The absorption layer ABL of the main region CRG may further include a plurality of auxiliary patterns ASP at or in an outer region thereof.

The water molecules WMC described above may remain on the top surface TSF of the EUV mask EMA exposed to the atmosphere. The water molecules WMC may remain on a surface of the absorption layer ABL and/or a top surface of the capping layer CPL. For example, the water molecules WMC may remain on the top surface of the capping layer CPL exposed between the patterns MAP, ASP and GRP of the absorption layer ABL.

Meanwhile, when the water molecules WMC remain on the top surface TSF of the EUV mask EMA and an inspection apparatus including an electron microscope is used, emitted electrons may react with the water molecules WMC to oxidize the absorption layer ABL and the capping layer CPL. When the capping layer CPL is damaged by the oxidation, a light reflectance of the EUV mask EMA in the EUV exposure apparatus of FIG. 4 may be severely reduced. This may cause a process defect of the EUV lithography process. Thus, to prevent the oxidation of the capping layer CPL in the process of inspecting the EUV mask EMA by using the electron microscope, the process of removing moisture in the load-lock chamber LLC may be required before the inspection of the EUV mask EMA. When the oxidation of the capping layer CPL of the EUV mask EMA is prevented in the inspection process, the EUV mask EMA may maintain an excellent light reflectance in a subsequent EUV lithography process using the EUV mask EMA.

Referring to FIG. 6, the process of removing moisture on the EUV mask EMA in the load-lock chamber LLC according to the aforementioned embodiments of the inventive concepts is schematically illustrated. When the UV light ULT is irradiated to the top surface TSF of the EUV mask EMA by the UV lamp UVL, the water molecules WMC remaining on the absorption layer ABL and the capping layer CPL may be evaporated.

The water molecules WMC detached from the absorption layer ABL and the capping layer CPL may be collected to the cold plate CDP disposed over the EUV mask EMA. As a result, the water molecules WMC may be trapped or captured by or to the cold trap CDT. Since the water molecules WMC are trapped to the cold trap CDT, the water molecules WMC may not be collected on the EUV mask EMA again.

The EUV mask EMA from which the water molecules WMC are completely removed may be moved into the main chamber MAC described above in FIGS. 1 to 3, and then, a mask inspection may be performed on the EUV mask EMA. The mask inspection may be performed by the electron microscope of the main chamber MAC. The electron microscope may emit electrons onto the EUV mask EMA to inspect whether the main patterns MAP, the auxiliary patterns ASP and the grating patterns GRP of the absorption layer ABL are accurately formed or not.

When a defect is not detected from the main patterns MAP, the auxiliary patterns ASP and the grating patterns GRP of the EUV mask EMA, the EUV mask EMA may be applied to the EUV exposure apparatus of FIG. 4 to project patterns onto the semiconductor substrate SUB by the EUV lithography process.

Figure 7:
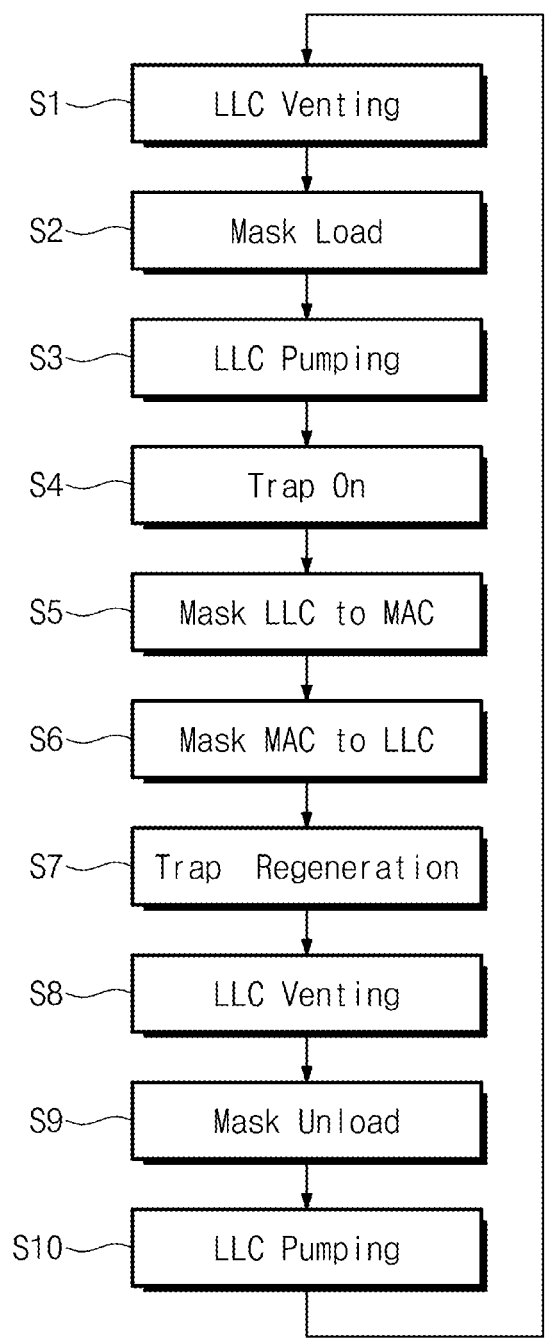
FIG. 7 is a flowchart illustrating a method for inspecting an EUV mask, according to some embodiments of the inventive concepts.

FIG. 7 is a flowchart illustrating a method for inspecting an EUV mask, according to some embodiments of the inventive concepts. FIGS. 8 to 17 are cross-sectional views schematically illustrating an EUV mask inspection system to explain the method for inspecting the EUV mask in FIG. 7.

Figure 8:
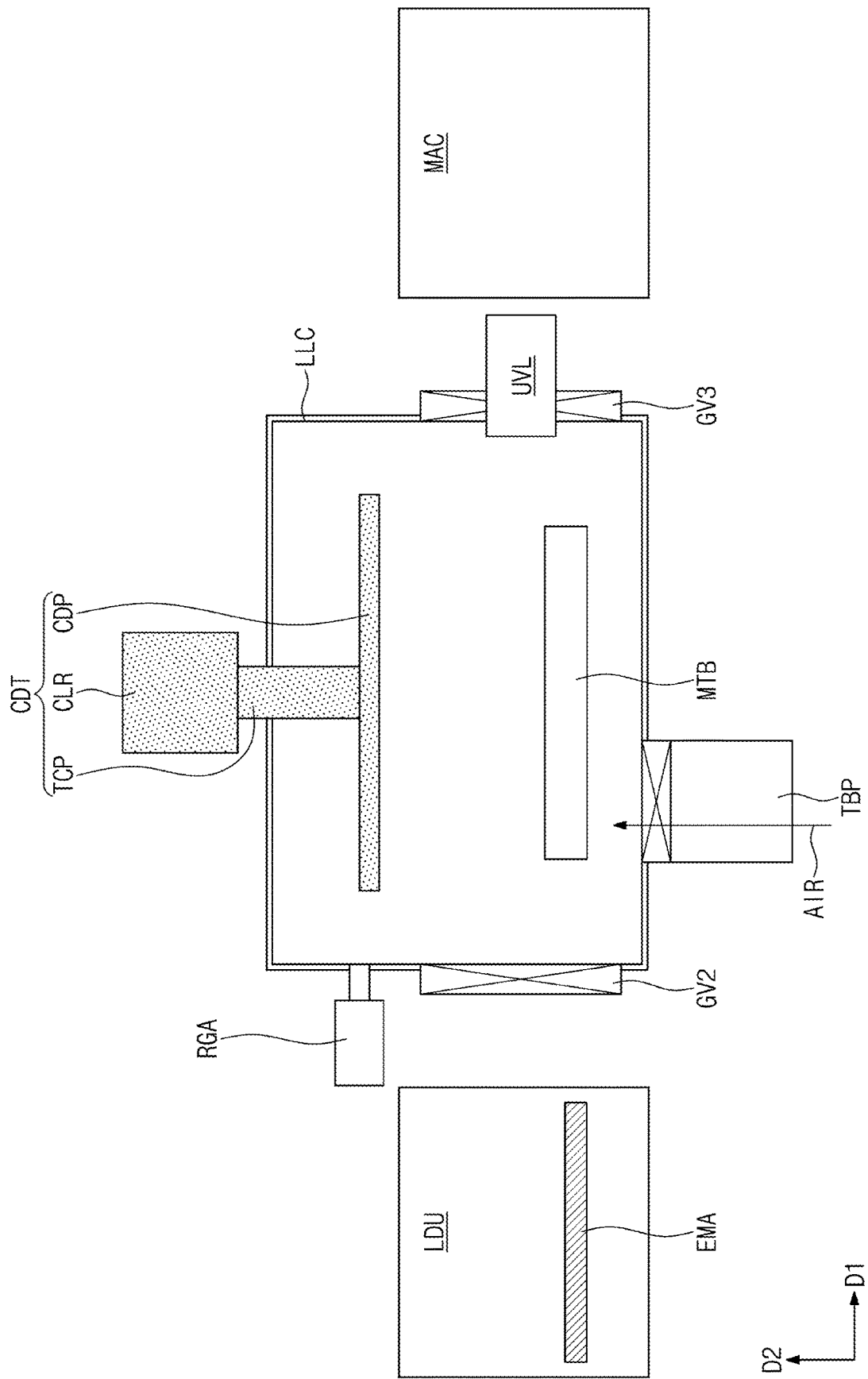
FIGS. 8 to 17 are cross-sectional views schematically illustrating an EUV mask inspection system to explain the method for inspecting the EUV mask in FIG. 7.

Referring to FIGS. 7 and 8, the EUV mask EMA to be inspected may be loaded into the mask receiving unit LDU. The load-lock chamber LLC may be vented to change the inner space of the load-lock chamber LLC from a vacuum state into an atmospheric pressure state (S1). For example, the venting of the load-lock chamber LLC may include injecting air AIR into the load-lock chamber LLC.

Figure 9:
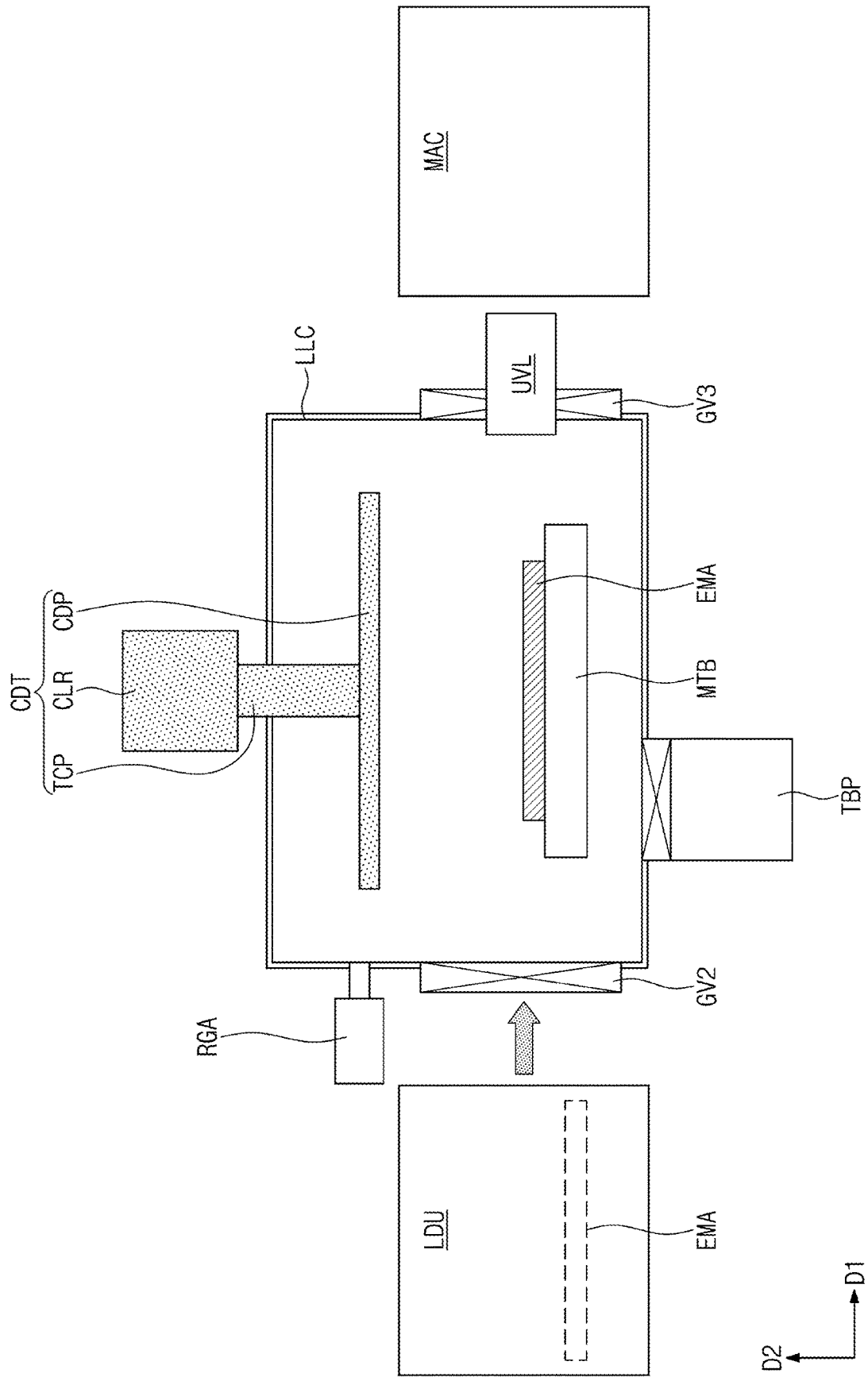

Referring to FIGS. 7 and 9, the second gate valve GV2 may be opened, and the EUV mask EMA may be moved from the mask receiving unit LDU and loaded onto the mask table MTB of the load-lock chamber LLC (S2). When the loading of the EUV mask EMA in the load-lock chamber LLC is completed, the second gate valve GV2 may be closed.

Figure 10:
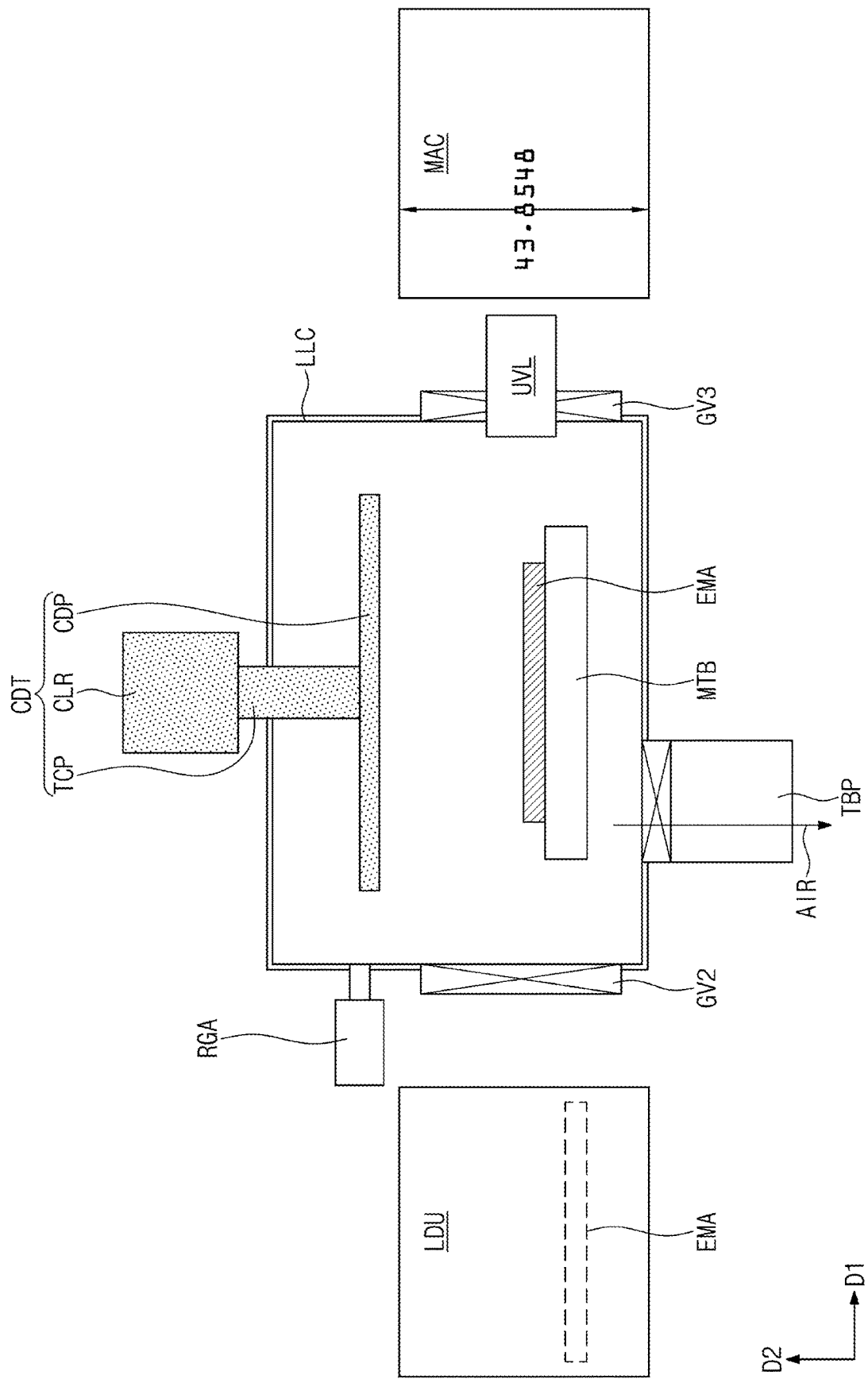

Referring to FIGS. 7 and 10, the inside (i.e., the inner space) of the load-lock chamber LLC may be pumped to change the inside of the load-lock chamber LLC from the atmospheric pressure state into the vacuum state (S3). For example, the pumping of the load-lock chamber LLC may include exhausting the air AIR in the load-lock chamber LLC to the outside by using the vacuum pump TBP.

Figure 11:
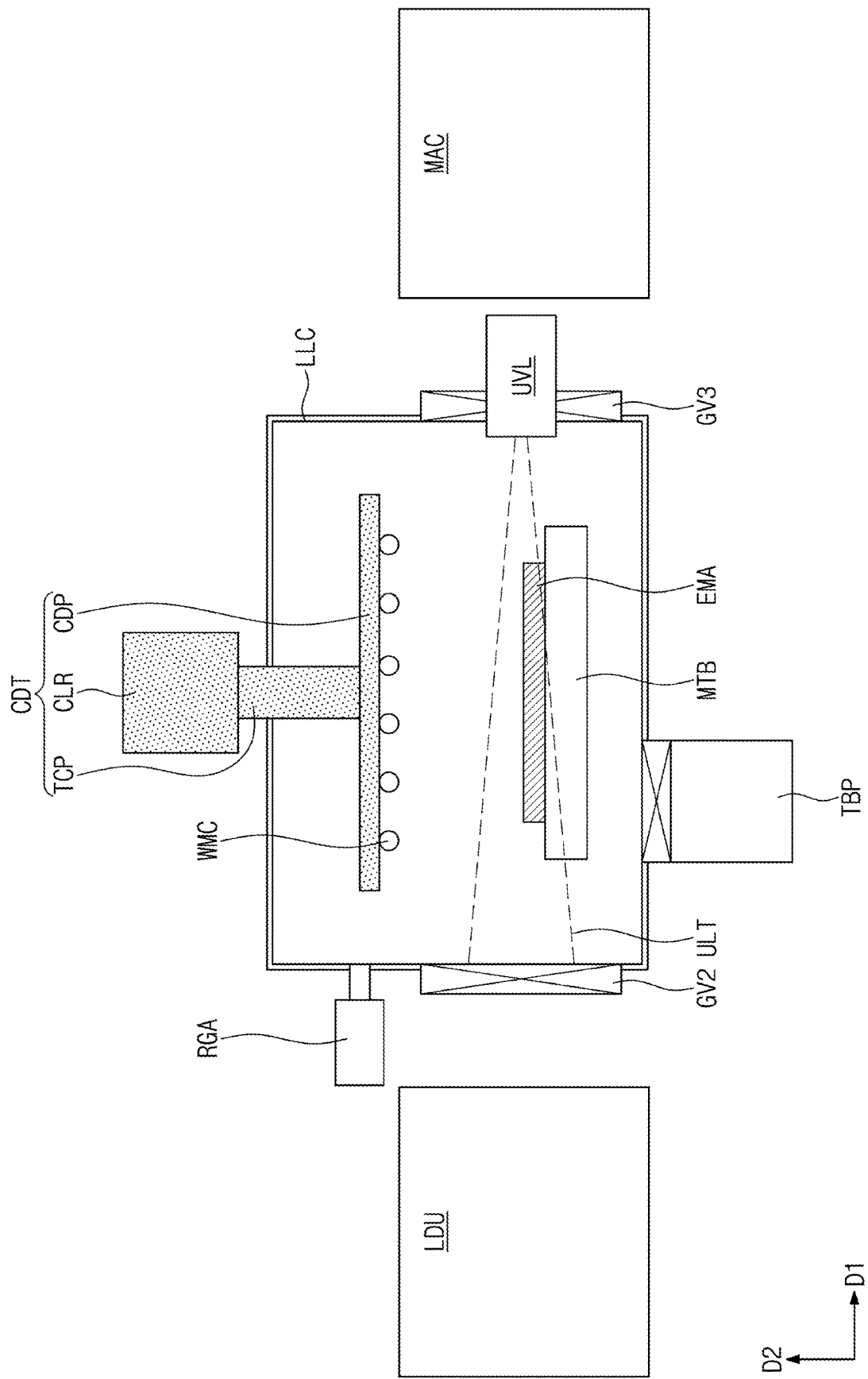

Referring to FIGS. 7 and 11, moisture on the EUV mask EMA may be trapped or captured on the cold trap CDT (S4). For example, the cold plate CDP of the cold trap CDT may be cooled. The cold plate CDP may be cooled by the cooling part CLR. The UV lamp UVL may irradiate the UV light ULT to the EUV mask EMA loaded on the mask table MTB. As described above with reference to FIG. 3, the moisture on the surface of the EUV mask EMA may be evaporated by the UV light ULT. The water molecules WMC detached from the EUV mask EMA may be collected or trapped on the cooled cold plate CDP.

Figure 12:
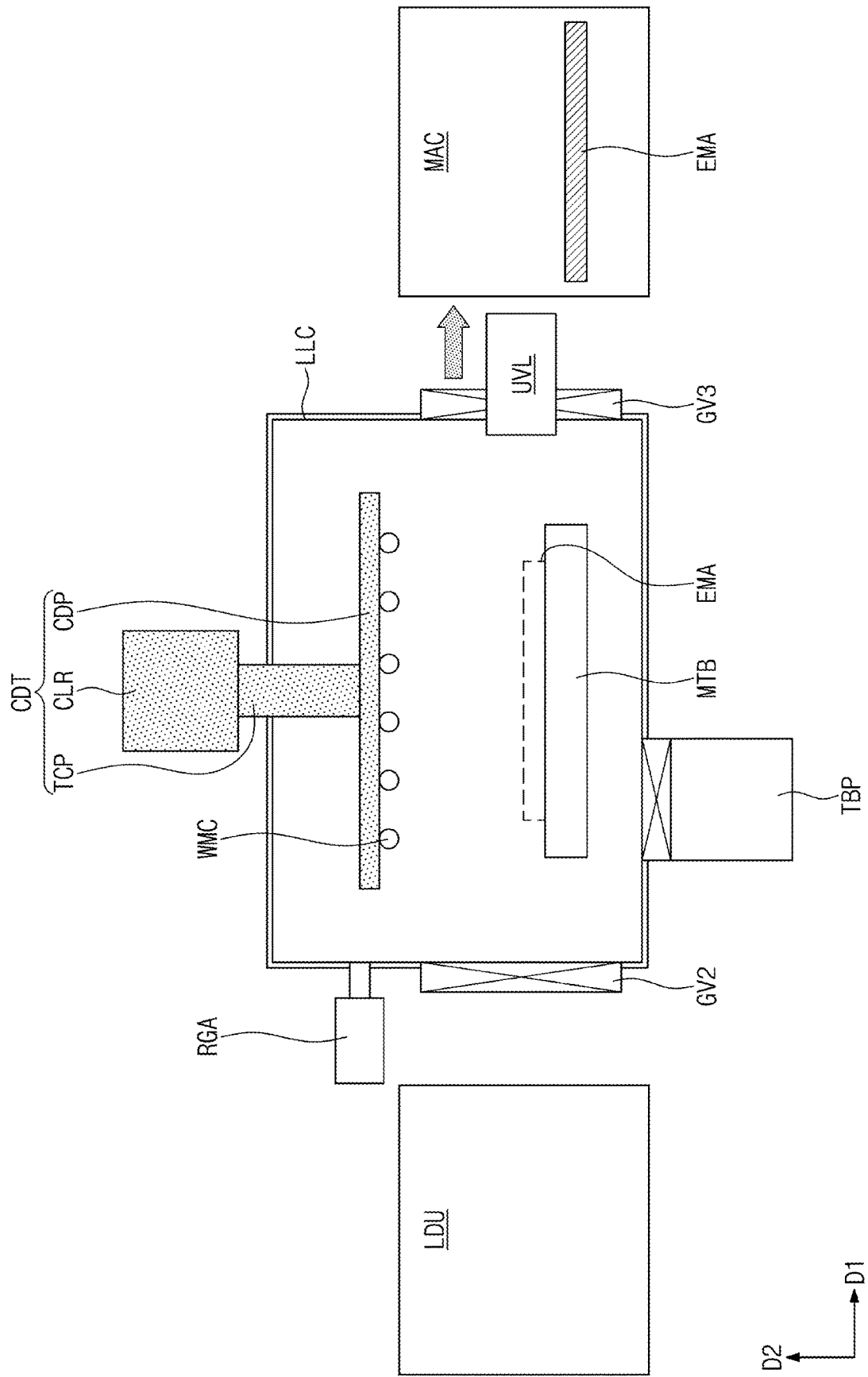

Referring to FIGS. 7 and 12, the third gate valve GV3 may be opened, and the EUV mask EMA from which the moisture is removed may be moved from the load-lock chamber LLC into the main chamber MAC (S5). When loading of the EUV mask EMA in the main chamber MAC is completed, the third gate valve GV3 may be closed.

An electron microscope inspection may be performed on the EUV mask EMA in the main chamber MAC. Electrons may be emitted from the electron microscope onto the EUV mask EMA. According to the embodiments of the inventive concepts, the moisture on the surface of the EUV mask EMA may be completely removed by the moisture removal process described above, and thus oxidation of the surface of the EUV mask EMA by the emitted electrons may not occur. As a result, the reflectance of the EUV mask EMA may not be reduced.

Figure 13:
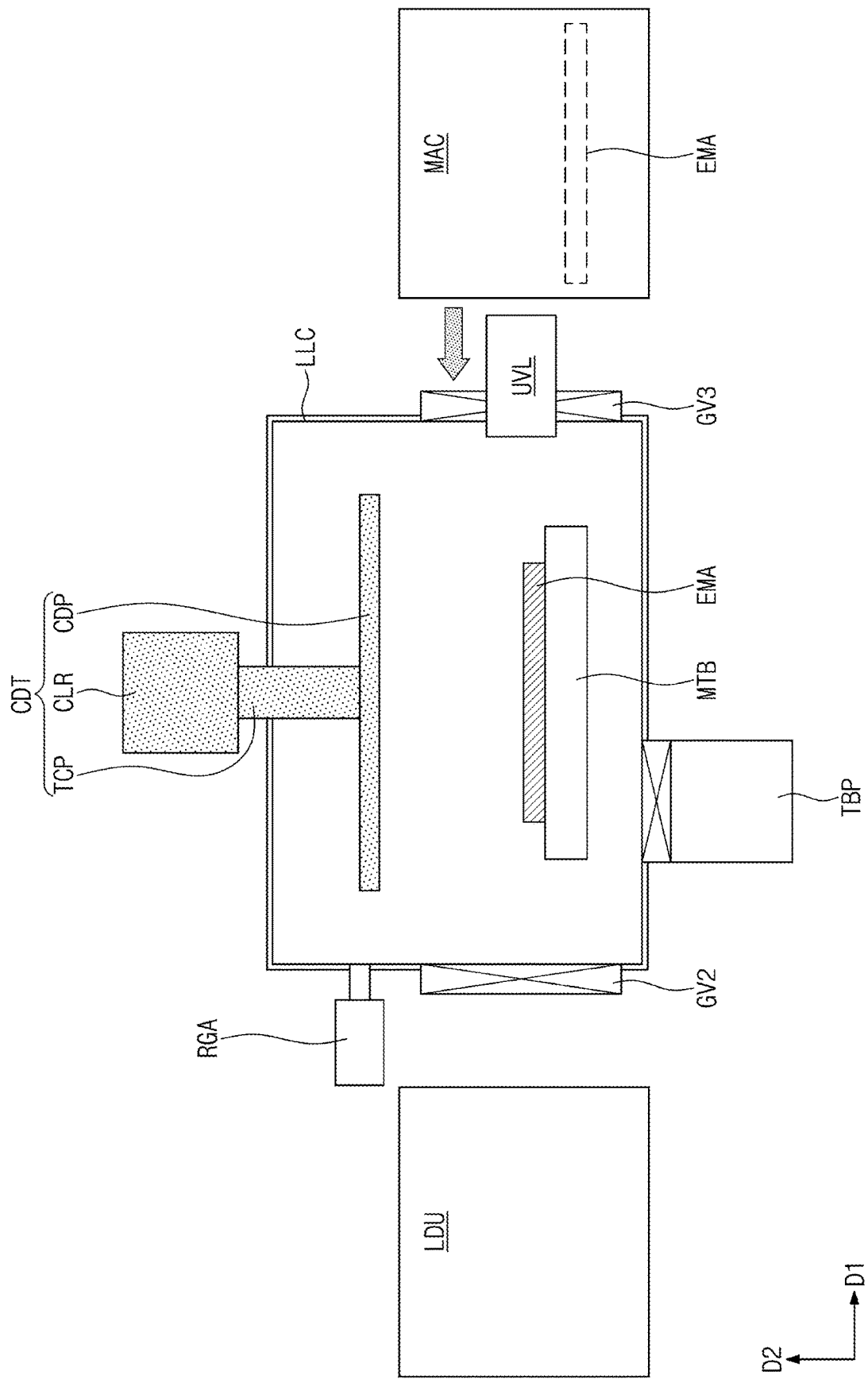

Referring to FIGS. 7 and 13, the third gate valve GV3 may be opened again, and the EUV mask EMA of which the inspection is completed may be moved from the main chamber MAC into the load-lock chamber LLC (S6). When loading of the EUV mask EMA in the load-lock chamber LLC is completed, the third gate valve GV3 may be closed.

Figure 14:
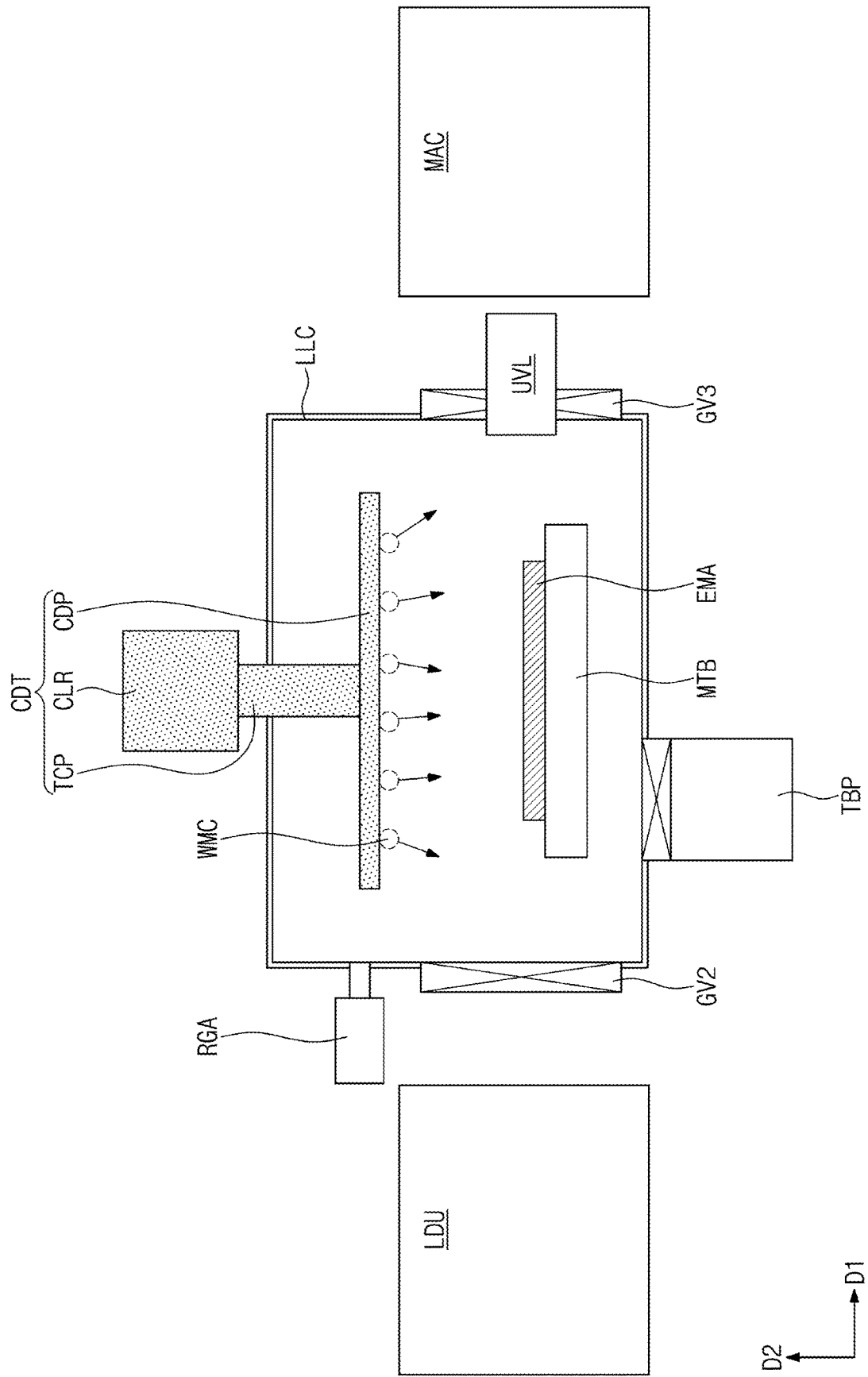

Referring to FIGS. 7 and 14, the cold trap CDT may be regenerated by removing the water molecules WMC collected on the cold plate CDP (S7). For example, the refrigeration cycle of the cooling part CLR may be reversely performed to heat the cooling part CLR. Heat may be transferred from the cooling part CLR to the cold plate CDP through the heat transfer part TCP, and thus a temperature of the cold plate CDP may rise. When the temperature of the cold plate CDP rises, the water molecules WMC on the cold plate CDP may be evaporated again and thus may be removed.

In the regeneration process of the cold trap CDT, the water molecules WMC may be collected again on the EUV mask EMA. However, since the electron microscope inspection of the EUV mask EMA has already been completed, the water molecules WMC collected again on the EUV mask EMA may not affect the reflectance of the EUV mask EMA.

Figure 15:
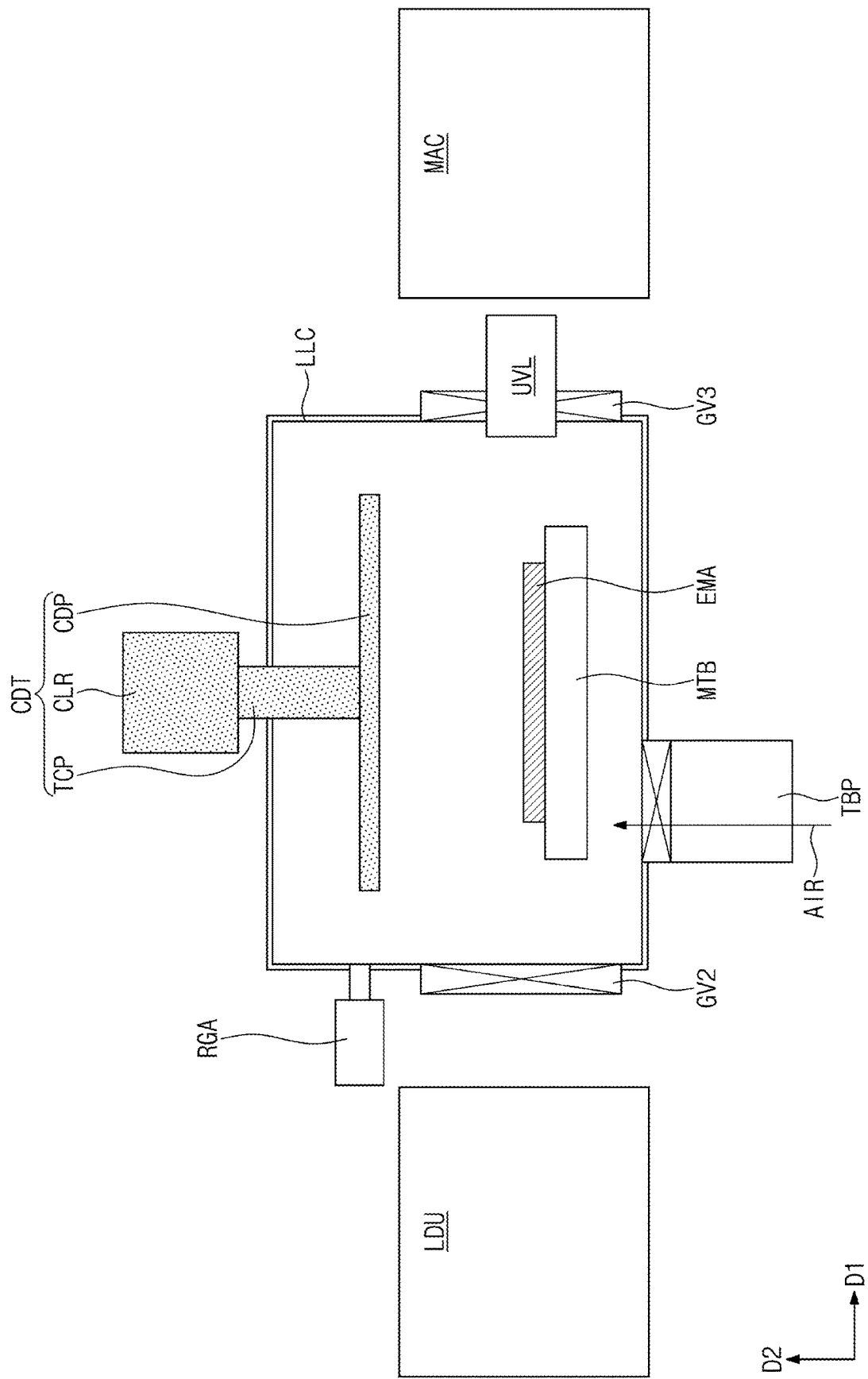

Referring to FIGS. 7 and 15, the load-lock chamber LLC may be vented to change the inside of the load-lock chamber LLC from the vacuum state into the atmospheric pressure state (S8). For example, the venting of the load-lock chamber LLC may include injecting air AIR into the load-lock chamber LLC.

Figure 16:
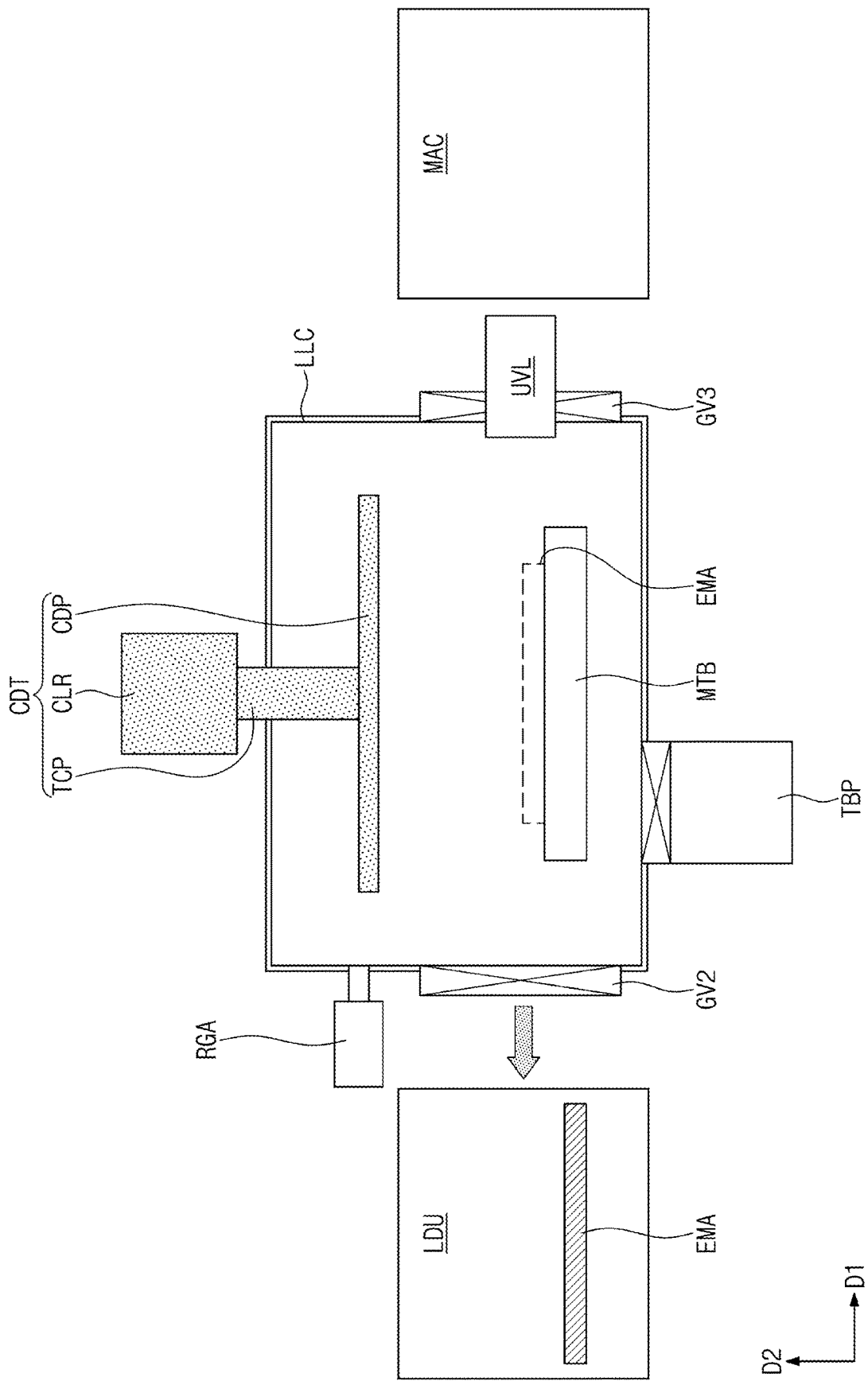

Referring to FIGS. 7 and 16, the second gate valve GV2 may be opened again, and the EUV mask EMA may be moved from the load-lock chamber LLC into the mask receiving unit LDU (S9). When unloading of the EUV mask EMA into the mask receiving unit LDU is completed, the second gate valve GV2 may be closed.

Figure 17:
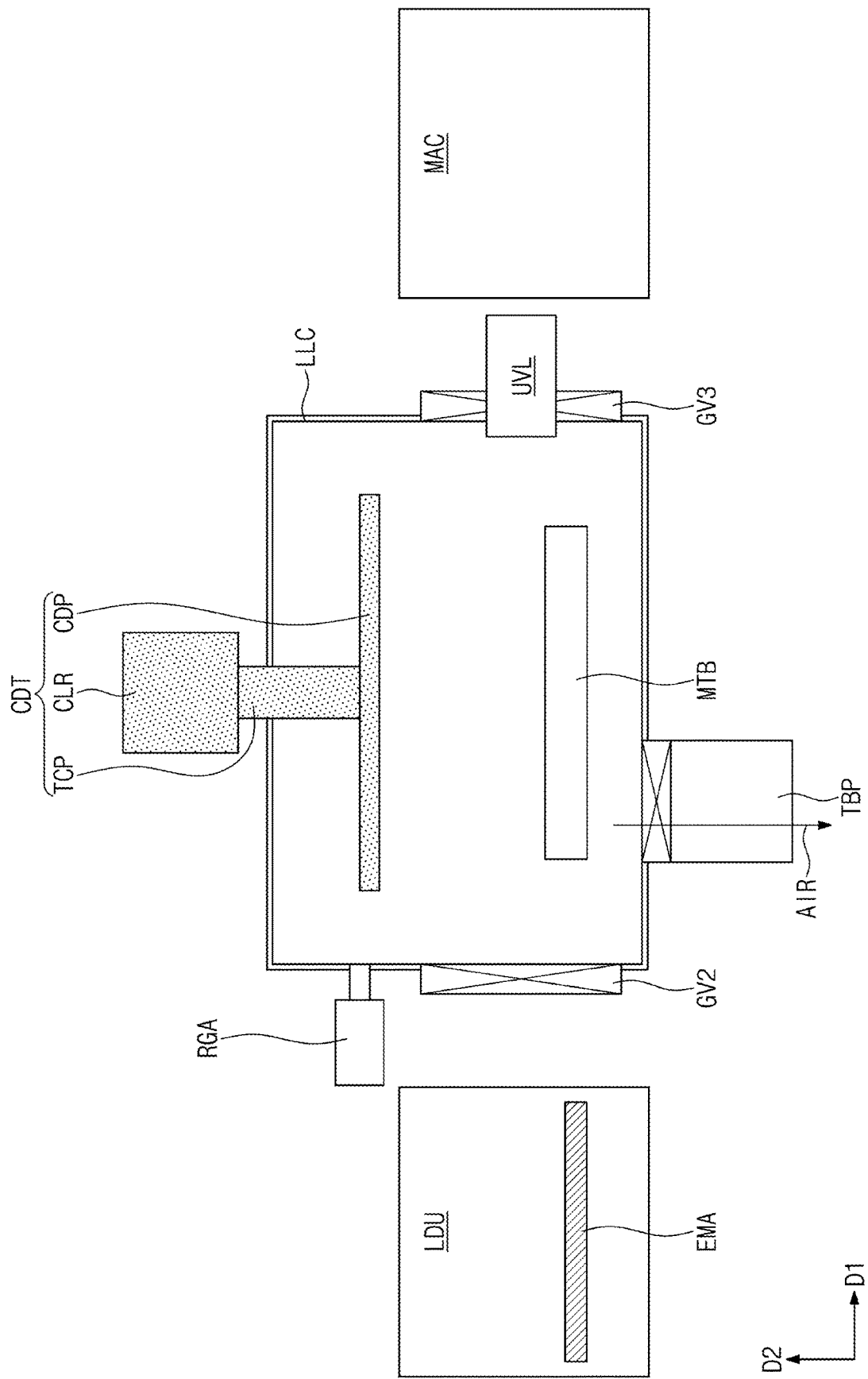

Referring to FIGS. 7 and 17, the inside (i.e., the inner space) of the load-lock chamber LLC may be pumped to change the inside of the load-lock chamber LLC from the atmospheric pressure state into the vacuum state (S10). The pumping of the load-lock chamber LLC may include exhausting the air AIR in the load-lock chamber LLC to the outside by using the vacuum pump TBP. The load-lock chamber LLC may wait until a next mask inspection while maintaining the vacuum state.

Figure 18:
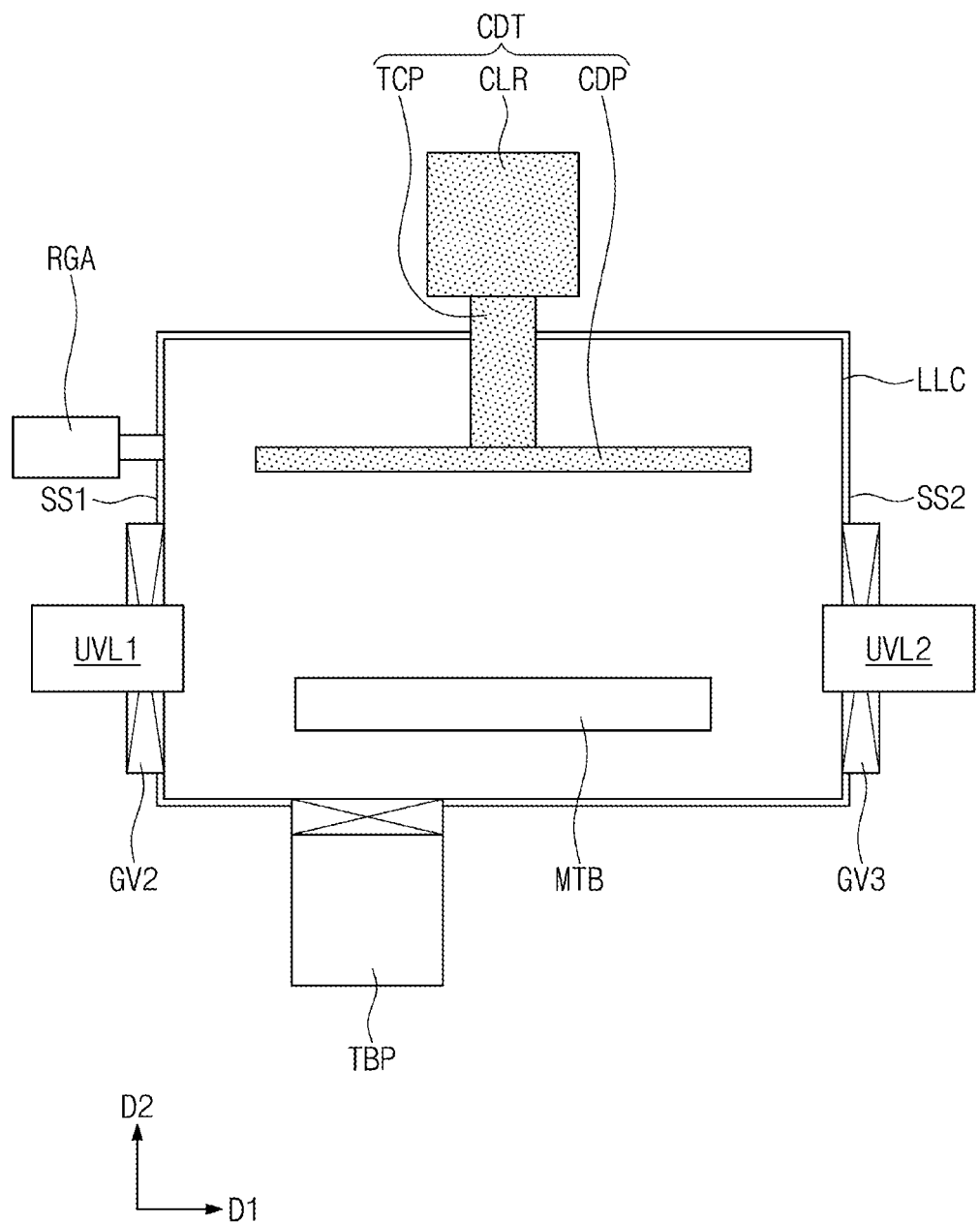
FIGS. 18 to 20 are cross-sectional views schematically illustrating load-lock chambers according to some embodiments of the inventive concepts.
Figure 19:
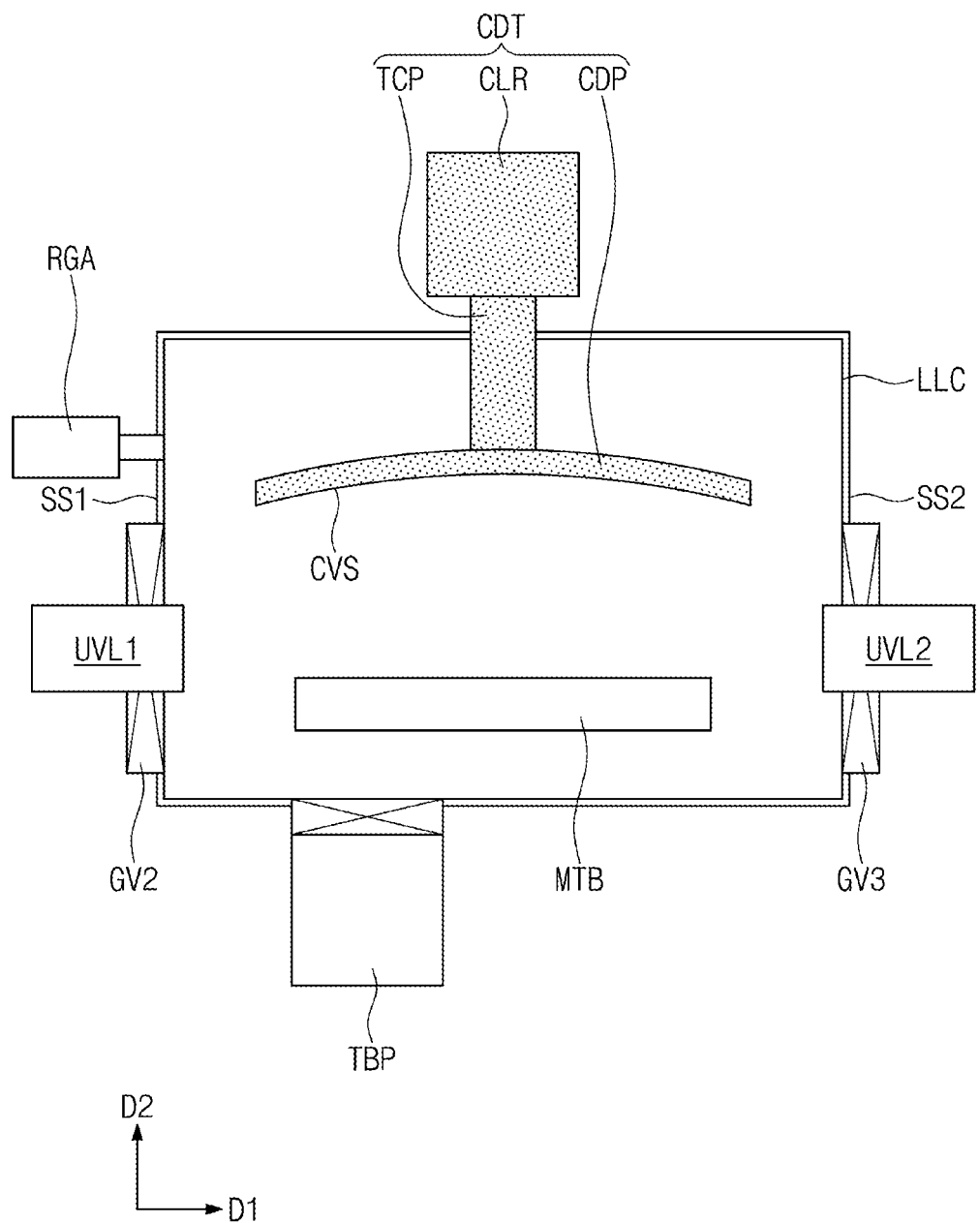
Figure 20:
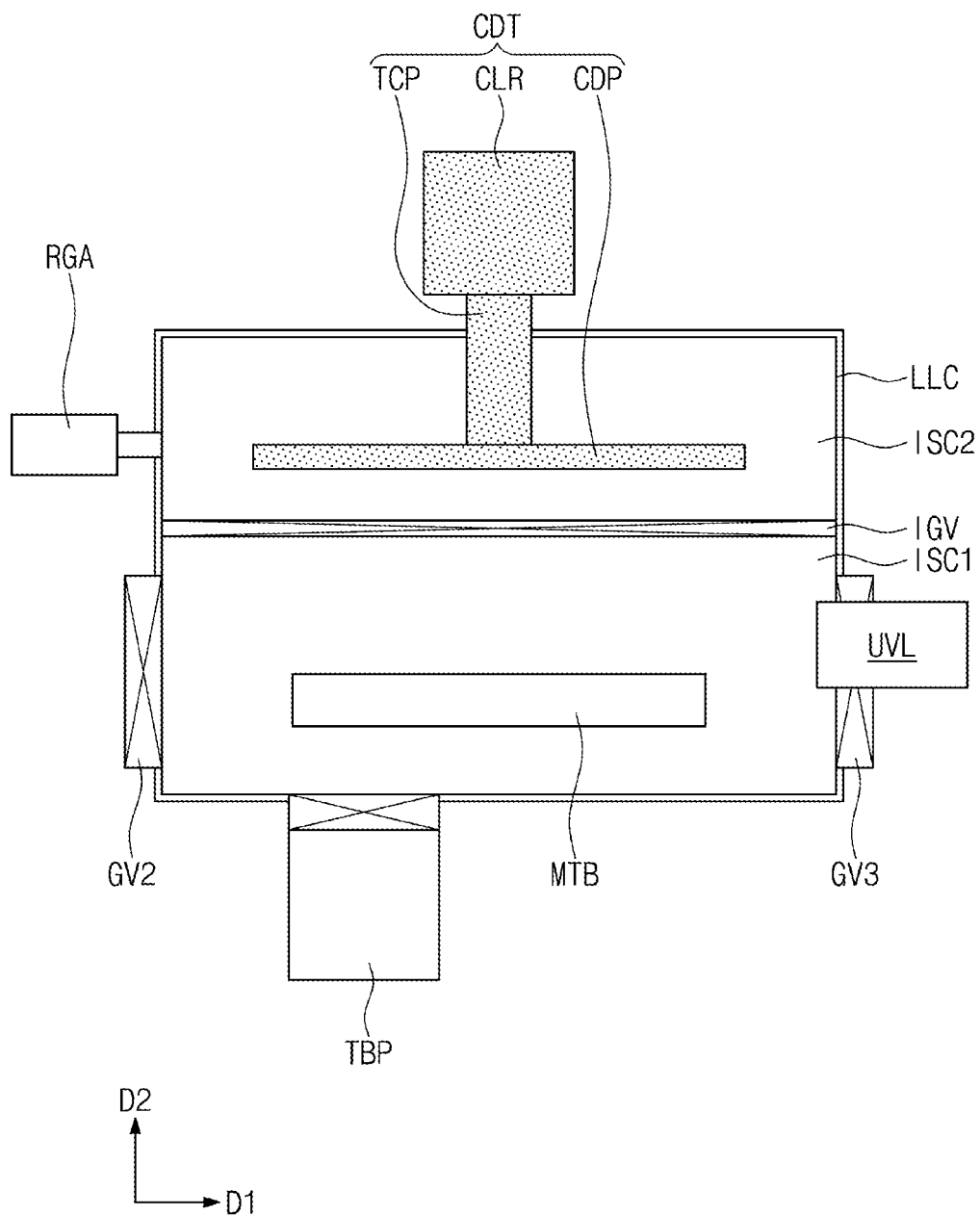

FIGS. 18 to 20 are cross-sectional views schematically illustrating load-lock chambers according to some embodiments of the inventive concepts. In the present embodiments, the descriptions to the same technical features as in the embodiments of FIGS. 1 to 3 may be omitted for the purpose of ease and convenience in explanation. In other words, differences between the present embodiments and the embodiments of FIGS. 1 to 3 will be mainly described hereinafter.

Referring to FIG. 18, a load-lock chamber LLC may include a plurality of UV lamps UVL. For example, the load-lock chamber LLC may include a first UV lamp UVL1 and a second UV lamp UVL2. The load-lock chamber LLC may have a first side surface SS1 and a second side surface SS2, which are opposite to each other in the first direction D1. The first UV lamp UVL1 may be provided at the first side surface SS1, and the second UV lamp UVL2 may be provided at the second side surface SS2. The first UV lamp UVL1 and the second UV lamp UVL2 may be horizontally adjacent to both (opposite) sidewalls of the mask table MTB, respectively.

According to the present embodiments, since the plurality of UV lamps UVL are provided adjacent to the mask table MTB, energy may be more efficiently transferred when UV light is irradiated onto an EUV mask.

Referring to FIG. 19, a cold plate CDP of the cold trap CDT may have a curved surface CVS. The cold plate CDP may be curved to protrude in a direction away from the mask table MTB, i.e., the second direction D2. For example, a cross section of the cold plate CDP may have a corn shape. The cold plate CDP may be concave relative to the mask table MTB. According to the present embodiments, the cold plate CDP may have the curved surface CVS, and thus the cold plate CDP may more effectively trap water molecules detached from an EUV mask.

Referring to FIG. 20, a load-lock chamber LLC may include an inner gate valve IGV. The inner gate valve IGV may be provided between the cold plate CDP and the mask table MTB. The inner gate valve IGV may divide the inside of the load-lock chamber LLC into a first inner space ISC1 and a second inner space ISC2.

The first inner space ISC1 may be a lower space of the load-lock chamber LLC. The mask table MTB may be disposed in the first inner space ISC1, and the second and third gate valves GV2 and GV3 and the UV lamp UVL may be connected to the first inner space ISC1. The first inner space ISC1 may be connected to the vacuum pump TBP. The second inner space ISC2 may be an upper space of the load-lock chamber LLC. The cold plate CDP may be disposed in the second inner space ISC2, and the moisture measuring device RGA may be connected to the second inner space ISC2.

When the inner gate valve IGV is opened, the first inner space ISC1 and the second inner space ISC2 may be (fluidly) connected to each other to form a single inner space. When the inner gate valve IGV is closed, the first inner space ISC1 and the second inner space ISC2 may be separated from each other. Thus, an inner pressure of the first inner space ISC1 and an inner pressure of the second inner space ISC2 may be controlled to be different from each other. One of the first and second inner spaces ISC1 and ISC2 may be maintained in a vacuum state, and the other thereof may be maintained in an atmospheric pressure state. For example, the first inner space ISC1 may be in the atmospheric pressure state, and the second inner space ISC2 may be in the vacuum state.

Figure 21:
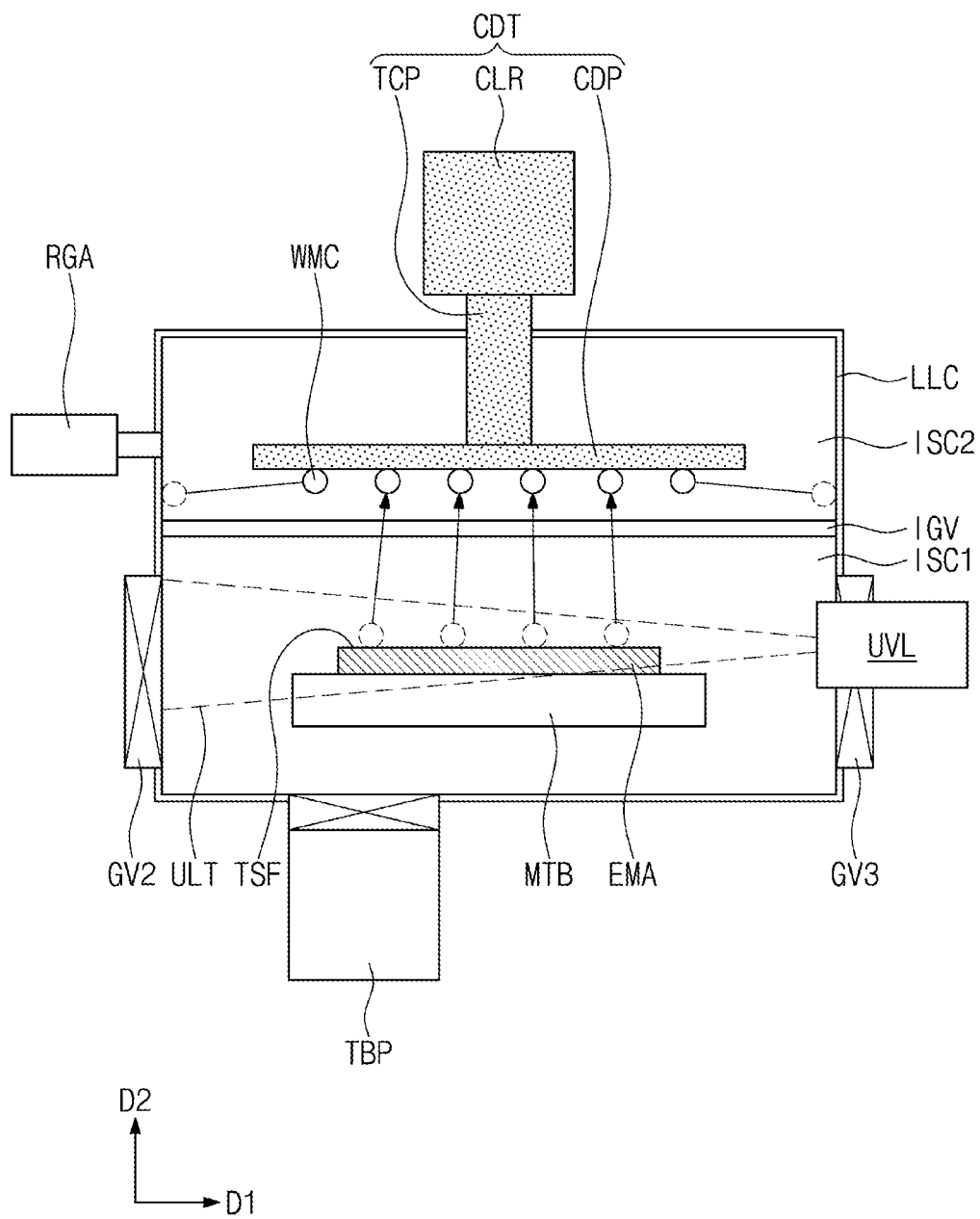
FIGS. 21 and 22 are cross-sectional views illustrating a process of removing moisture using the load-lock chamber of FIG. 20.
Figure 22:
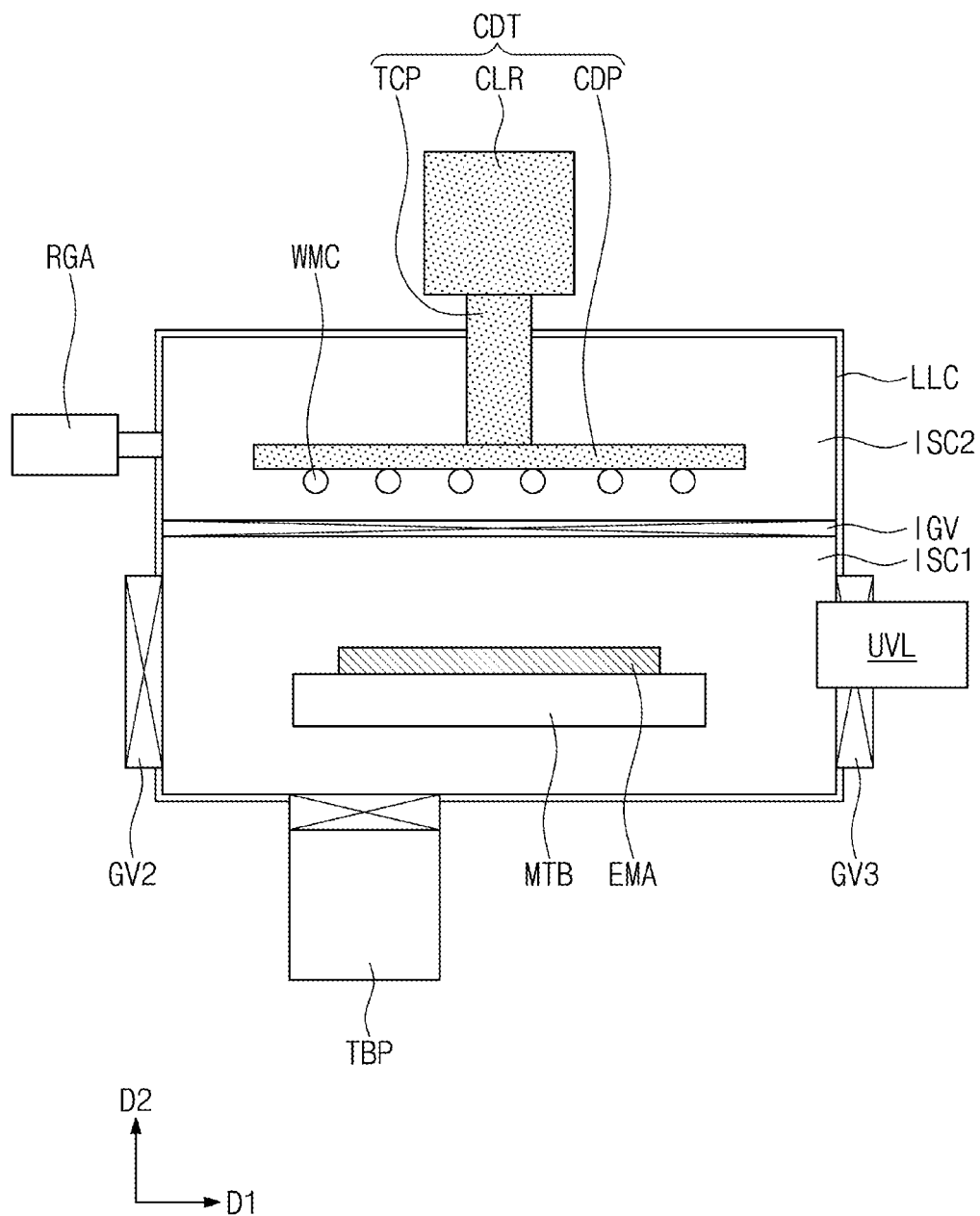

FIGS. 21 and 22 are cross-sectional views illustrating a process of removing moisture using the load-lock chamber of FIG. 20.

Referring to FIG. 21, the inner gate valve IGV may be opened, and the moisture removal process described above with reference to FIG. 11 may be performed on the EUV mask EMA. The water molecules WMC in the first inner space ISC1 may move into the second inner space ISC2 through the opened inner gate valve IGV and thus may be collected or trapped by or on the cold plate CDP.

Referring to FIG. 22, when the moisture removal process is completed, the inner gate valve IGV may be closed to separate the first inner space ISC1 from the second inner space ISC2. Thus, it is possible to completely prevent the water molecules WMC trapped in the second inner space ISC2 from affecting the EUV mask EMA provided in the first inner space ISC1.

According to the present embodiments, the inner space of the load-lock chamber LLC may be divided into the first inner space ISC1 and the second inner space ISC2 by the inner gate valve IGV, and thus it is possible to completely prevent moisture from being collected on the EUV mask EMA again. In addition, the regeneration of the cold trap CDT (see S7 of FIG. 7) after the inspection of the EUV mask EMA may be performed independently in only the second inner space ISC2, thereby preventing moisture from being collected again on the EUV mask EMA loaded again in the first inner space ISC1. The venting of the load-lock chamber LLC (see S8 of FIG. 7), the unloading of the EUV mask EMA (see S9 of FIG. 7) and the pumping of the load-lock chamber LLC (see S10 of FIG. 7) may be performed independently in only the first inner space ISC1 to efficiently change a pressure state of the load-lock chamber LLC.

The EUV mask inspection system according to the embodiments of the inventive concepts may completely and efficiently remove moisture on the surface of the EUV mask in the load-lock chamber. As a result, it is possible to prevent damage of the EUV mask which may be caused in the main chamber for performing the inspection, and thus accuracy and reliability of the EUV lithography process may be improved. The load-lock chamber according to the embodiments of the inventive concepts may effectively remove and trap moisture on the surface of the EUV mask by using the UV lamp and the cold trap without damage of the EUV mask.

While the inventive concepts have been described with reference to example embodiments, it will be apparent to those skilled in the art that various changes and modifications may be made without departing from the scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An extreme ultraviolet (EUV) mask inspection system comprising:
   a mask receiving unit configured to receive a manufactured EUV mask;

a main chamber configured to perform an inspection on the EUV mask; and a load-lock chamber disposed between the mask receiving unit and the main chamber, wherein the load-lock chamber comprises:

a mask table for loading the EUV mask;

an ultraviolet (UV) lamp disposed adjacent the mask table in a first direction;

a cold trap disposed adjacent the mask table in a second direction that is perpendicular to the first direction; and a vacuum pump, wherein the first direction is a direction perpendicular to a sidewall of the mask table, wherein the second direction is a direction perpendicular to a top surface of the mask table, wherein the UV lamp is configured to evaporate water molecules on the EUV mask by irradiating UV light onto the EUV mask, and wherein the cold trap is configured to trap the water molecules evaporated from the EUV mask.

2. The EUV mask inspection system of claim 1, wherein the cold trap comprises:

a cooling part disposed outside the load-lock chamber;

a cold plate disposed in the load-lock chamber; and a heat transfer part connecting the cold plate to the cooling part, wherein the cold plate is vertically aligned with the mask table.

3. The EUV mask inspection system of claim 2, wherein an area of the cold plate is greater than an area of the mask table.

4. The EUV mask inspection system of claim 2, wherein the cold plate is curved to protrude in the second direction and has a curved surface that is concave relative to the mask table.

5. The EUV mask inspection system of claim 1, wherein the load-lock chamber further comprises an inner gate valve disposed between the mask table and the cold trap, and wherein the inner gate valve is configured to divide an inner space of the load-lock chamber into a first inner space in which the mask table is disposed and a second inner space in which the cold trap is disposed.

6. The EUV mask inspection system of claim 1, wherein the load-lock chamber further comprises a moisture measuring device configured to measure moisture trapped on the cold trap.

7. The EUV mask inspection system of claim 1, wherein the main chamber comprises an electron microscope configured to emit electrons onto the EUV mask.

8. The EUV mask inspection system of claim 1, wherein the UV lamp comprises a plurality of UV lamps, and wherein the plurality of UV lamps are disposed around the mask table.

9. A load-lock chamber comprising:

a mask table for loading an extreme ultraviolet (EUV) mask;

an ultraviolet (UV) lamp disposed adjacent the mask table in a first direction;

a cold trap disposed adjacent the mask table in a second direction that is perpendicular to the first direction;

a vacuum pump; and an inner gate valve disposed between the mask table and the cold trap, wherein the inner gate valve is configured to divide an inner space of the load-lock chamber into a first inner space in which the mask table is disposed and a second inner space in which the cold trap is disposed.

10. The load-lock chamber of claim 9, wherein the first direction is a direction perpendicular to a sidewall of the mask table, and wherein the second direction is a direction perpendicular to a top surface of the mask table.

11. The load-lock chamber of claim 9, wherein the UV lamp is configured to evaporate water molecules on the EUV mask by irradiating UV light onto the EUV mask along a path that is parallel to a top surface of the EUV mask or that defines an acute angle with the top surface of the EUV mask, and wherein the cold trap is configured to trap the water molecules evaporated from the EUV mask.

12. The load-lock chamber of claim 9, wherein the cold trap comprises:

a cooling part disposed outside the load-lock chamber;

a cold plate disposed in the second inner space of the load-lock chamber; and a heat transfer part connecting the cold plate to the cooling part, wherein the cold plate is vertically aligned with the mask table.

13. The load-lock chamber of claim 12, wherein an area of the cold plate is greater than an area of the mask table.

14. The load-lock chamber of claim 12, wherein the cold plate is curved to protrude in the second direction and has a curved surface that is concave relative to the mask table.

15. A method for inspecting an extreme ultraviolet (EUV) mask, the method comprising:

loading a manufactured EUV mask into a mask receiving unit;

moving the EUV mask from the mask receiving unit into a load-lock chamber;

irradiating ultraviolet (UV) light onto the EUV mask by an UV lamp of the load-lock chamber to evaporate water molecules on the EUV mask by the UV light;

trapping the water molecules evaporated from the EUV mask by using a cold trap of the load-lock chamber;

moving the EUV mask from the load-lock chamber into a main chamber; and performing an inspection on the EUV mask in the main chamber.

16. The method of claim 15, further comprising:

moving the EUV mask from the main chamber into the load-lock chamber after the inspection is completed;

regenerating the cold trap to remove the trapped water molecules from the cold trap; and moving the EUV mask from the load-lock chamber into the mask receiving unit.

17. The method of claim 15, wherein the UV lamp is provided adjacent the EUV mask in a first direction, wherein the cold trap is provided adjacent the EUV mask in a second direction, wherein the first direction is a direction perpendicular to a side surface of the EUV mask, and wherein the second direction is a direction perpendicular to a top surface of the EUV mask.

18. The method of claim 17, wherein the cold trap comprises:

a cooling part disposed outside the load-lock chamber;

a cold plate disposed in the load-lock chamber; and a heat transfer part connecting the cold plate to the cooling part, wherein the cold plate vertically overlaps with the EUV mask.

19. The method of claim 15, wherein the performing the inspection on the EUV mask comprises emitting electrons onto the EUV mask by an electron microscope of the main chamber.

20. The method of claim 15, wherein the EUV mask comprises: a mask substrate; a reflective layer on the mask substrate; a capping layer on the reflective layer; and an absorption layer on the capping layer,
  wherein the absorption layer comprises a plurality of patterns, and
  wherein the water molecules remain on a top surface of the capping layer exposed between the plurality of patterns before the irradiating of the UV light.

* * * * *